United States Patent
Rhee et al.

(10) Patent No.: US 10,514,392 B2
(45) Date of Patent: Dec. 24, 2019

(54) PROBE CARD, TEST APPARATUS INCLUDING THE PROBE CARD, AND RELATED METHODS OF MANUFACTURING

(71) Applicants: Samsung Electronics Co., Ltd., Suwon-si (KR); Korea Advanced Institute Of Science And Technology, Daejeon (KR)

(72) Inventors: Min-woo Rhee, Seoul (KR); Duke Kimm, Suwon-si (KR); Jae-hong Kim, Seoul (KR); Ji-nyeong Yun, Yongin-si (KR); In-kyu Park, Daejeon (KR); Jun-bo Yoon, Daejeon (KR); Dong-uk Kwon, Daejeon (KR); Seung-hwan Kim, Daejeon (KR); Chang-keun Kim, Daejeon (KR); Yong-hoon Yoon, Daejeon (KR)

(73) Assignees: SAMSUNG ELECTRONICS CO., LTD., Samsung-ro, Yeongtong-gu, Suwon-si, Gyeonggi-do (KR); KOREA ADVANCED INSTITUTE OF SCIENCE AND TECHNOLOGY, Daehak-Ro, Yuseong-Gu, Daejeon (KR)

( * ) Notice: Subject to any disclaimer, the term of this patent is extended or adjusted under 35 U.S.C. 154(b) by 97 days.

(21) Appl. No.: 15/871,561

(22) Filed: Jan. 15, 2018

(65) Prior Publication Data
US 2019/0064219 A1    Feb. 28, 2019

(30) Foreign Application Priority Data

Aug. 22, 2017    (KR) .................. 10-2017-0106254

(51) Int. Cl.
*G01R 31/10* (2006.01)
*G01R 1/073* (2006.01)
(Continued)

(52) U.S. Cl.
CPC ..... *G01R 1/07364* (2013.01); *G01R 1/06716* (2013.01); *G01R 1/06733* (2013.01);
(Continued)

(58) Field of Classification Search
CPC .. G01R 31/2889; G01R 1/07342; G01R 3/00; G01R 1/07378; G01R 31/2886;
(Continued)

(56) References Cited

U.S. PATENT DOCUMENTS 5,923,178 A    7/1999  Higgins et al.
5,952,843 A    9/1999  Vinh
(Continued)

FOREIGN PATENT DOCUMENTS

EP    2110673    10/2009
JP    2015-158464    9/2015
KR    10-1478714    2/2014

*Primary Examiner* — Raul J Rios Russo
(74) *Attorney, Agent, or Firm* — Muir Patent Law, PLLC

(57) ABSTRACT

Provided are improved manufacturing methods of semiconductor devices, probe cards, test apparatuses including the probe card, and methods for manufacturing probe cards. The probe card includes a circuit board, a support located under the circuit board, and a plurality of probe needles located on a bottom surface of the support. Each of the probe needles has a tip configured to contact a side surface of a bump included in a test target. The support may include a stress absorption layer located on a bottom surface to which the probe needles are connected. Manufacturing of semiconductor devices may comprise forming elongated conductive bumps on a body of a semiconductor device, testing the semiconductor device by contacting tips of the probe needles to sides surfaces of the bumps and packaging of the semiconductor device.

18 Claims, 30 Drawing Sheets

(51) Int. Cl.
*G01R 1/067* (2006.01)
*H01R 13/24* (2006.01)
*G01R 31/28* (2006.01)
*H01R 11/18* (2006.01)
*H01R 12/57* (2011.01)
*H01R 12/52* (2011.01)
*H01R 12/70* (2011.01)
*H01R 12/71* (2011.01)

(52) U.S. Cl.
CPC ..... *G01R 1/07342* (2013.01); *G01R 1/07357* (2013.01); *G01R 1/07378* (2013.01); *G01R 31/2886* (2013.01); *G01R 31/2887* (2013.01); *G01R 31/2889* (2013.01); *H01R 11/18* (2013.01); *H01R 13/24* (2013.01); *H01R 13/2464* (2013.01); *H01R 12/52* (2013.01); *H01R 12/57* (2013.01); *H01R 12/7076* (2013.01); *H01R 12/714* (2013.01); *H01R 13/2471* (2013.01); *H01R 13/2478* (2013.01); *H01R 2201/20* (2013.01)

(58) Field of Classification Search
CPC .... H01R 12/57; H01R 12/52; H01R 12/7076; H01R 12/714
USPC ......... 324/71, 378, 403, 415, 425, 500, 537, 324/754.01, 754.03, 754.07
See application file for complete search history.

(56) References Cited

U.S. PATENT DOCUMENTS

| | | |
|---|---|---|
| 6,181,144 B1 | 1/2001 | Hembree et al. |
| 6,411,112 B1 | 6/2002 | Das et al. |
| 6,529,021 B1 | 3/2003 | Yu et al. |
| 7,218,127 B2 | 5/2007 | Cooper |
| 7,893,704 B2 | 2/2011 | Gleason et al. |
| 8,415,963 B2 | 4/2013 | Kister |
| 9,250,290 B2 | 2/2016 | Namburi |
| 2003/0094962 A1* | 5/2003 | Rincon ............. G01R 1/07342 324/756.03 |
| 2004/0166702 A1 | 8/2004 | Higashi |
| 2005/0116351 A1 | 6/2005 | Kirby et al. |
| 2006/0066328 A1 | 3/2006 | Clegg et al. |
| 2006/0103399 A1 | 5/2006 | Kuo |
| 2006/0170440 A1 | 8/2006 | Sudin |
| 2007/0252608 A1 | 11/2007 | Koizumi et al. |
| 2008/0001612 A1 | 1/2008 | Kister |
| 2008/0018350 A1 | 1/2008 | Chao et al. |
| 2009/0224782 A1 | 9/2009 | Chen et al. |
| 2012/0086466 A1 | 4/2012 | Chou |
| 2012/0242363 A1 | 9/2012 | Breinlinger et al. |
| 2014/0043054 A1 | 2/2014 | Kister |
| 2014/0132300 A1 | 5/2014 | Cros et al. |
| 2015/0192608 A1 | 7/2015 | Hsu |
| 2018/0024165 A1* | 1/2018 | Funk ................. G01R 31/2889 324/750.25 |
| 2019/0154730 A1* | 5/2019 | Fukami ................... G01R 1/06 |

* cited by examiner

PROBE CARD, TEST APPARATUS INCLUDING THE PROBE CARD, AND RELATED METHODS OF MANUFACTURING

CROSS-REFERENCE TO RELATED APPLICATION

This application claims the benefit of Korean Patent Application No. 10-2017-0106254, filed on Aug. 22, 2017, in the Korean Intellectual Property Office, the disclosure of which is incorporated herein in its entirety by reference.

BACKGROUND

The inventive concept relates to a test apparatus, probe cards, methods of manufacturing semiconductor devices, and methods of manufacturing probe cards.

In general, various tests may be performed at various stages of the manufacturing of semiconductor devices. For example, to test electrical characteristics of semiconductor devices prior to packaging the same, a probe card including fine probe needles may be used as an interface between a tester and the semiconductor devices. Specifically, the probe needles of the probe card may be brought into contact with minute micro-bumps formed on a semiconductor device. Electric signals may be transmitted from the tester to the semiconductor device, and signals output by the semiconductor device in response to the transmitted electric signal are detected and analyzed to determine if the semiconductor device is defective or non-defective. When the semiconductor device is tested, the micro-bumps may have a height deviation due to height differences among the micro-bumps and/or warpage of the semiconductor device serving as the test target. The manufacture of probe cards for stable tests in consideration of the height deviation of the micro-bumps may be unsatisfactory in terms of economical efficiency and mass productivity. Lately, this problem has worsened with an increase in the number of micro-bumps and further miniaturization causing continued reduction of pitches of the bumps.

SUMMARY

The inventive concept is directed to improved manufacturing methods of semiconductor devices, probe cards, test apparatuses including the probe card, and methods for manufacturing probe cards.

According to an aspect of the inventive concept, a method of manufacturing comprises providing a semiconductor device on a stage, the semiconductor device comprising a plurality of pads at a first surface of the semiconductor device, and a plurality of conductive bumps, each of the conductive bumps connected to a pad at a base of the conductive bump and extending away from the first surface of the semiconductor device to terminate at an end of the bump, each conductive bump having a first side surface extending between the base and the end; providing a testing apparatus including a probe card, the probe card comprising a support, and a plurality of conductive probe needles connected to a first surface of the support, each probe needle having a first end connected to the first surface of the support and a tip at a second end opposite to the first end; bringing the plurality of conductive probe needles in contact with the plurality of conductive bumps such that each tip of the plurality of conductive probe needles is in contact with a corresponding first side surface of a corresponding conductive bump; testing the semiconductor device while the tips of the plurality of conductive probe needles are in contact with the first side surfaces of the conductive bumps, including communication of electrical signals between the testing apparatus and the semiconductor device via the contact of the tips of the plurality of conductive probe needles and the first side surfaces. The method may also comprise packaging the semiconductor device and/or forming the plurality of conductive bumps and/or forming an integrated circuit in the body of the semiconductor device.

In some examples, bringing the plurality of conductive probe needles in contact with the plurality of conductive bumps comprises sliding each tip of the plurality of conductive probe needles downwardly along the corresponding first side surface of the corresponding conductive bump.

During the testing of the semiconductor device, each of the plurality of conductive probe needles may be elastically deformed and after testing of the semiconductor device, each of the conductive probe needles may be brought out of contact with the semiconductor device and be restored to its original shape prior to bringing the plurality of conductive probe needles in contact with the plurality of conductive bumps.

Bringing the plurality of conductive probe needles in contact with the plurality of conductive bumps may comprise rotating the bases of the conductive probe needles such as b by at least 3° or more. The bases of the conductive probe needles may be formed on an elastic organic material, such as a polymer.

Vertical deviation of the bumps due to warping of the semiconductor device may be accommodated by providing contact of the bumps on the side of the bumps during testing. Relatively simplified probe cards may thus be used, having probe needles formed via semiconductor manufacturing processes, and thus may be able to provide probe needles spaced at a very fine pitch. For example, the conductive probe needles may be spaced at a pitch of 55 µm or less and have a length of 300 µm or less.

Methods of manufacturing may comprise forming the plurality of conductive bumps by forming a mold layer on a body of the semiconductor device, patterning the mold layer to provide vias over corresponding one of the pads, performing a first electroplating process to partially fill the vias with the first conductive material, performing a second electroplating process to form the second conductive material on the first conductive material, and removing the mold layer. Each of the conductive bumps may be elongated and extend above the first surface of the body of the semiconductor device by a distance that is at least three times larger than its maximum width.

Contact with the first side surfaces of the conductive bumps may be at locations vertically spaced from the first surface by a distance between 20% to 80% of the first vertical distance, such as being vertically spaced away from the tip of the first bump by at least ⅓ of the first vertical distance.

The probe card may comprise one or more stoppers on the first surface of the support extending away from the support a first distance that is greater than the lengths of each probe needle, and may contact the first surface of the semiconductor device with the one or more stoppers when the plurality of conductive probe needles contacts the first side surfaces of the conductive bumps to control a vertical location of the tips of the conductive probe needles and their contact locations with respect to the side surfaces of the conductive bumps. In addition, reducing warpage of the semiconductor device may be reduced during the testing step by applying a force to the semiconductor device with the stoppers which may reduce a vertical deviation of the location of ends of the conductive bumps.

Methods of manufacturing also include methods to manufacture probe cards described herein, such as a method comprising the steps of providing a support; forming a mold layer on the support; forming plurality of openings in the mold layer; depositing metal within each of the plurality of openings at the same time to form a plurality of probe needles, each probe needle comprising a beam formed within a corresponding opening of the mold layer, a proximal end integrally connected to the support and having a metallic bond with at least part of the support, and a tip at a distal end opposite to the proximal end; and removing the molding layer.

Forming the plurality of openings in the mold layer may be performed by photolithographic processes, such as selectively exposing a photoresist layer with light using a photolithographic mask.

Depositing metal within each of the plurality of openings to form the plurality of probe needles may be performed via electroplating. Such electroplating may also be used in the process of forming stoppers in some examples.

Also disclosed are the probe cards and test apparatus configured with such probe cards, where such probe cards and test apparatus may have a configuration to be used in the methods described herein.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
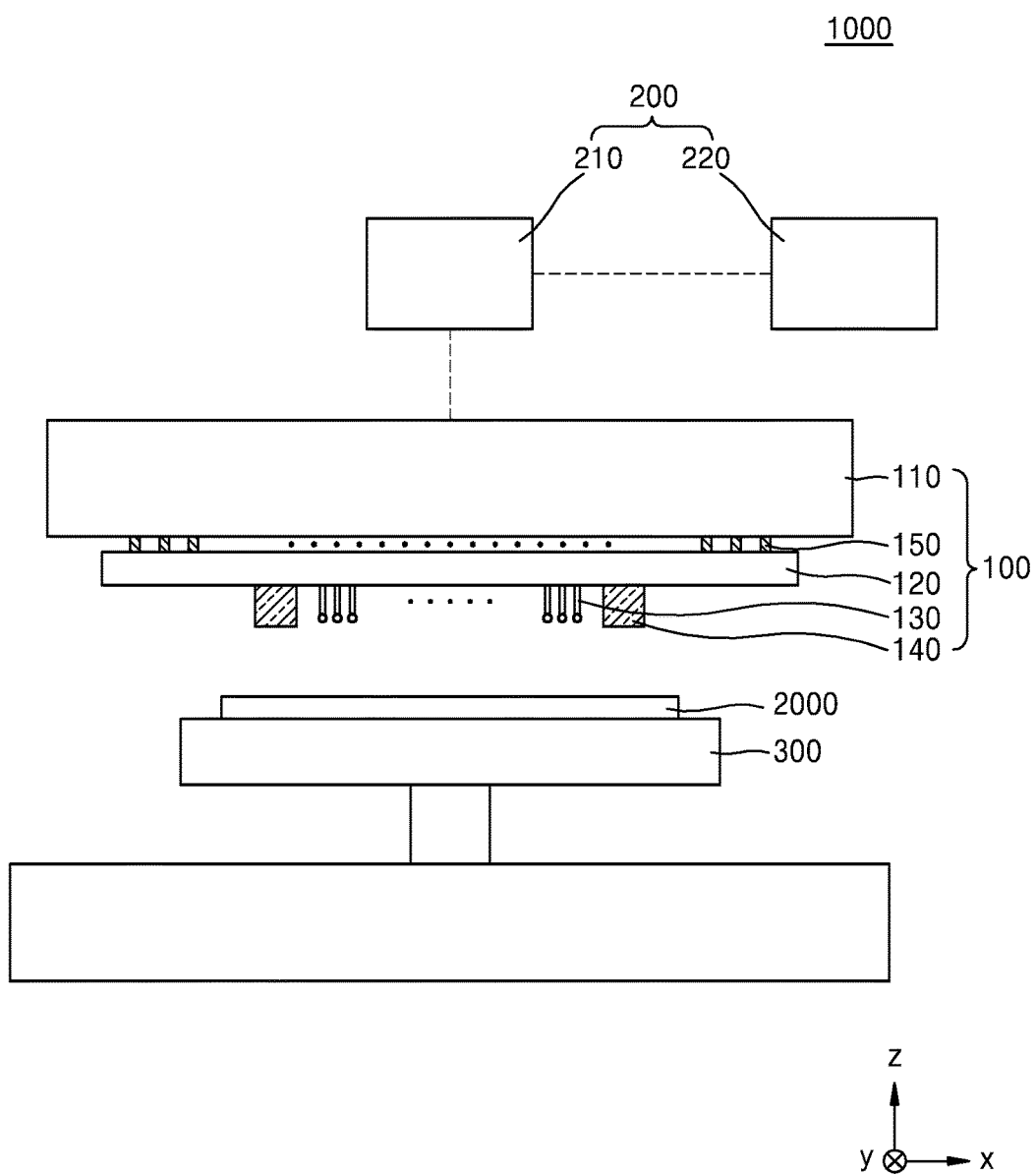
FIG. 1 is a schematic view showing construction of a test apparatus including a probe card according to an embodiment.

Embodiments will now be described more fully with reference to the accompanying drawings, in which embodiments are shown. Like reference numerals in the drawings denote like elements, and thus descriptions thereof will be omitted.

Figure 2:
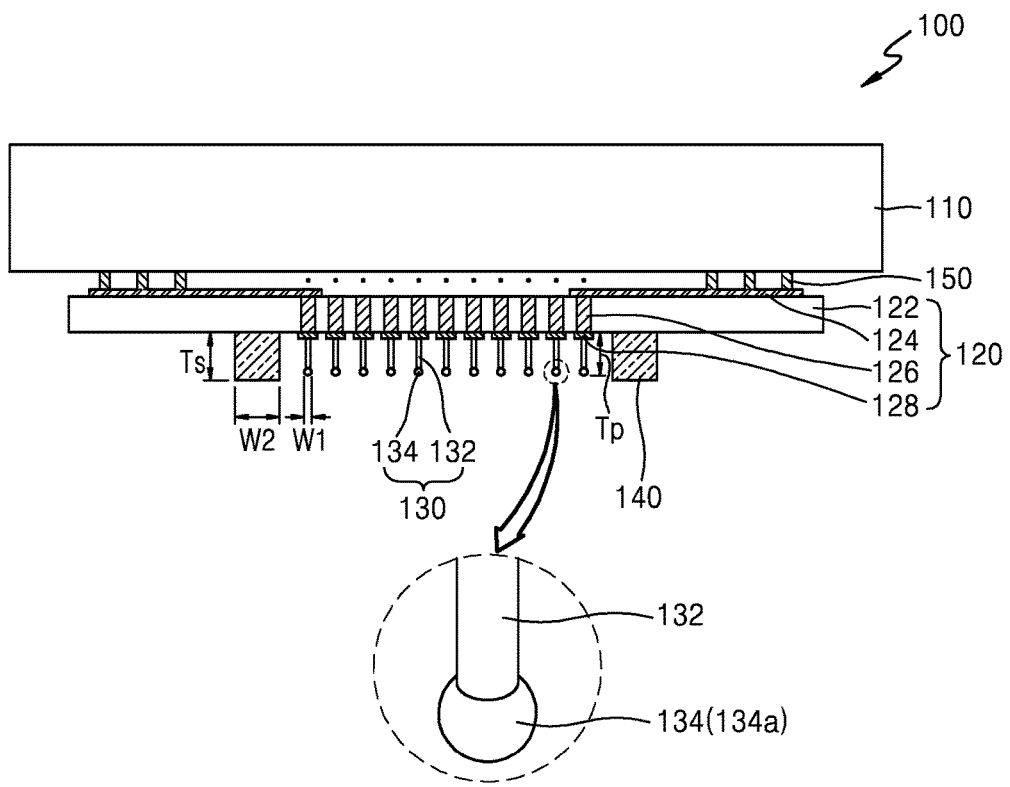
FIG. 2 is a specific cross-sectional view of the probe card in the test apparatus of FIG. 1.

FIG. 1 is a schematic view showing construction of a test apparatus 1000 including a probe card 100 according to an embodiment, and FIG. 2 is an exemplary cross-sectional view of the probe card 100 in the test apparatus 1000.

Referring to FIGS. 1 and 2, the test apparatus 1000 of the present embodiment may include the probe card 100, a tester 200, and a stage 300.

The probe card 100 may include a circuit board 110, a support 120, and probe needles 130.

The circuit board 110 may correspond to a body of the probe card 100 and include a plurality of interconnections. The circuit board 110 may be electrically connected to the support 120 through connection members 150. The connection members 150 may be embodied by various structures capable of electrically connecting the circuit board 110 with the support 120. For example, the connection members 150 may be embodied by solder balls or conductive pins located on a bottom surface of the circuit board 110. The connection members 150 may be in contact with contact points of redistribution lines 124 (e.g., a landing pads formed of the same metal layer forming redistribution lines 124 and integrally connected with a corresponding one of the redistribution lines) on a top surface of the support 120. In some embodiments, the connection members 150 may be embodied by interposers (e.g., through substrate vias within a silicon wafer or ceramic substrate). However, the connection members 150 are not limited to the above-described structures.

The support 120 may be removably coupled to the circuit board 110. Thus, female or male coupling members may be formed at an outer portion of the bottom surface of the circuit board 110. For example, the support 120 may be bolt-coupled, hook-coupled, or snap-coupled to the circuit board 110. Naturally, coupling between the support 120 and the circuit board 110 is not limited to the above-described coupling methods. In some embodiments, coupling members for coupling the support 120 with the circuit board 110 may not be located at the outer portion but at a central portion of the bottom surface of the circuit board 110.

The support 120 may include a substrate 122, the redistribution lines 124, through vias 126, and contact pads 128. The support 120 may serve to transform a small pitch of the probe needles 130 located on a bottom surface of the support 120 into a large pitch of the connection members 150 that are in contact with the redistribution lines 124 located on the top surface of the support 120. Thus, the support 120 may also be referred to as a pitch transformer.

Although FIG. 2 illustrates a case in which the redistribution lines 124 are connected only to outermost ones of the through vias 126 for brevity of illustration, however, it will be understood that the redistribution lines 124 may connect all the through vias 126 to a corresponding one of the connection members 150. Also, although FIG. 2 illustrates a case in which three connection members 150 are connected to the same redistribution line 124 due to cross-sectional characteristics, each connection member 150 may be connected to a different redistribution line 124.

In some embodiments, the redistribution lines 124 of the support 120 may be located on a bottom surface of the substrate 122, and/or formed as several vertically spaced layers connected by several sets of through vias 126 formed in the substrate 122. Also, the probe card 100 of the present and other disclosed embodiments may have use other structures for support 120. For example, the support 120 may be formed as a multi-layer ceramic/multi-layer organic (MLC/MLO) structure. When the support 120 has an MLC or MLO structure, an MLC substrate or an MLO substrate may be used, and through vias and interconnections may be formed in each layer.

The probe needles 130 may be located on the contact pads 128 on the bottom surface of the support 120. The probe needles 130 may be connected to the contact pads 128 through a chemical bond, such as a metallic bond, to be integrally formed with the contact pads 128. In some embodiments, the contact pads 128 may be omitted from the support 120. In this case, the probe needles 130 may be directly connected to the through vias 126 of the support 120. The probe needles 130 may include a highly durable metal having high conductivity. For example, the probe needles 130 may include nickel (Ni), a nickel alloy, such as nickel-cobalt (Ni—Co) or nickel-manganese (Ni—Mn), tungsten (W), palladium (Pd), copper (Cu), silver (Ag), gold (Au), a copper alloy, or a gold alloy. Naturally, materials included in the probe needles 130 are not limited to the above-described materials. In some embodiments, the probe needles 130 may be plated with gold. Although FIG. 2 illustrates about 10 probe needles 130 for brevity, significantly more probe needles, such as 50 or more probe needles 130, may be formed at a single cross section of the probe card 100 (e.g., along a single horizontal line) and spaced at a very small pitch, such as a pitch of 55 μm or less.

Each of the probe needles 130 may include a beam 132 and a tip 134 located at a distal end of the beam 132. In some examples, each of the probe needles 130 may include a base (e.g., base 136) located at a proximal end of the beam 132 (e.g., at an end opposite to the tip 134 near support 120). The base may be formed as wider than the beam 132, such as a conductive metal pad, and may be the same or different metal material than beam 132. The beams 132 may be connected to the bases 136 through a chemical bond, such as a metallic bond, to be integrally formed with the bases 136. The beam 132 may have an elongate cylindrical shape. Naturally, the beam 132 is not limited to the cylindrical shape. For example, a horizontal cross section of the beam 132 may have an elliptical shape or a polygonal shape. The beam 132 may have the same width over the entire length or taper downward. Here, the width of the beam 132 refers to the size of the beam in the horizontal direction with respect to FIG. 2, such as to a diameter of the cylinder when the beam is implemented to have a cylindrical shape. The length of the beam refers to the distance between the proximal end of the beam 132 and distal end of the beam (in the vertical direction with respect to FIG. 2) and may correspond to a length of any one side in the polygonal pillar shape.

The tip 134 may have such a shape as to easily come into contact with a bump of a semiconductor device that is a test target. For example, the tip 134 may be formed as a substantially spherical tip 134a, which may approximate a spherical shape, an ellipsoid shape, an ovoid shape, etc., as shown in the enlarged portion of FIG. 2. Here, reference to a substantially spherical shape includes such alternative shapes that are not perfectly geometrical. Naturally, the shape of the tip 134 is not limited to the substantially spherically shaped tip 134a. The shape of the tip 134 may take many forms, such as those described below in further detail with reference to FIGS. 6A to 6D. In this application, generic reference to a tip, probe needles and probe cards will use reference numerals 134, 130 and 100 respectively, while reference to a particular type of tip and the probe needles and probe card implementing the same will include a suffix to these reference numerals (e.g., 134d, 130d and 100c in FIG. 6B). Thus, although several embodiments represent tip 134 as spherical this should be understood to generically represent a tip. It should thus be appreciated that the device, system and method embodiments described herein may each be implemented with the different probe tips described herein, with use of the reference numerals 134, 130 and 100 without a suffix being used to emphasize the same. In addition, although the embodiment of FIGS. 5A-5C refers to the probe card with reference numeral 100a, the implementation of the stress absorption layer 160 described with respect to this embodiment may also be implemented in the other device, system and method embodiments described herein.

Figure 3A:
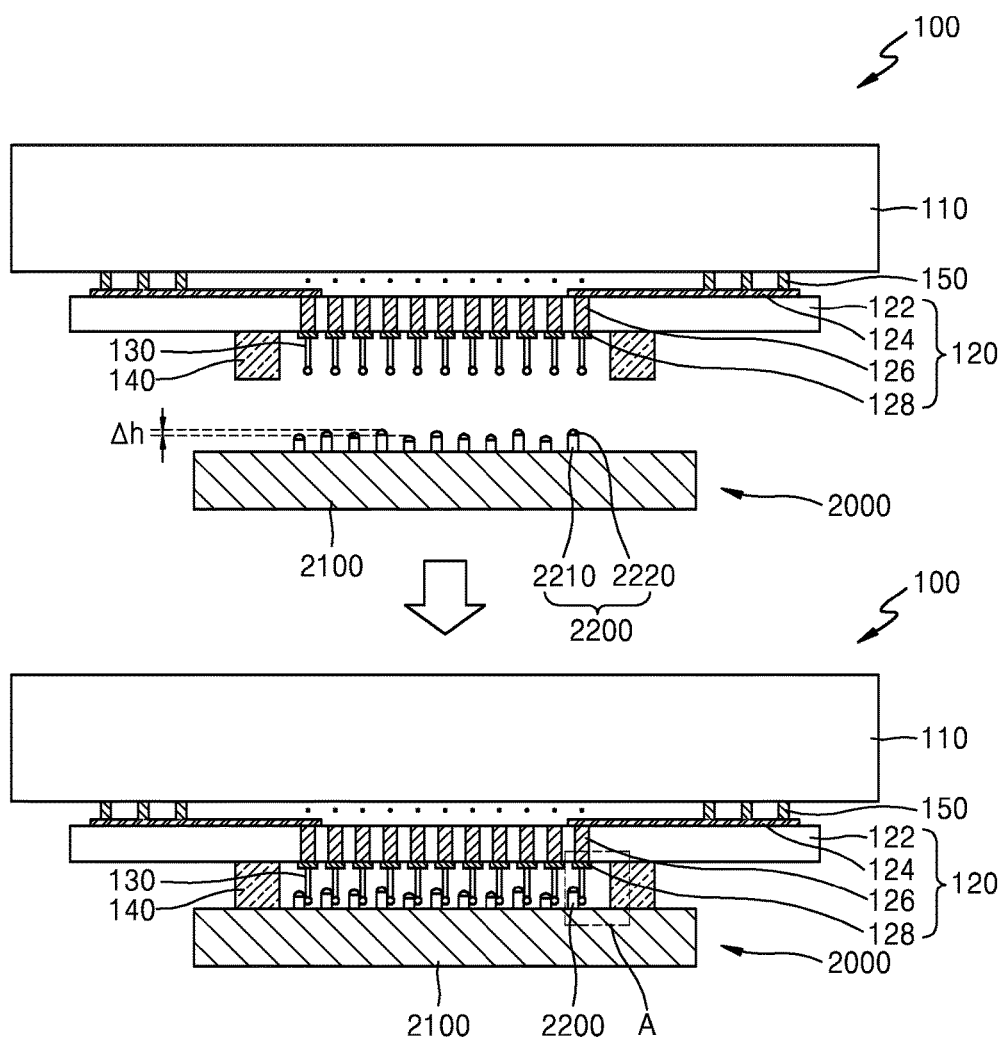
FIG. 3A is a conceptual diagram illustrating principles by which a semiconductor device is tested by using the probe card of FIG. 2.

In the probe card 100 of the present embodiment, each of the probe needles 130 may have such a shape as to laterally contact a bump of a semiconductor device 2000 that is a test target, especially, a bump (refer to 2200 in FIG. 3A) having a structure including a metal pillar (refer to 2210 in FIG. 3A) and a solder (refer to 2220 in FIG. 3A). Thus, in the probe card 100 of the present embodiment, each of the probe needles 130 may have a length Tp of several hundred μm or less and a width W1 of several tens of μm or less. For example, each of the probe needles 130 may have a length Tp of about 300 μm or less, or about 200 μm or less and a width W1 of 30 μm or less, such as 20 μm or less, or even 16 μm or less. Each of the probe needles may have a length Tp that is at least 16 times its width W1, such as between 16 times to 20 times its width W1. In some examples, the width of the beam 132 may vary, to have a larger width at its proximal end (at the connection to support 120) than at its distal end (at the connection to tip 134), such as being larger by 20% or more. For example, the width of the beam 132 at its proximal end may be 20 μm or less and the width of the beam 132 at its distal end may be 16 μm or less. The width of the tip 134 of the probe needle 130 may be greater than 1.5 times, such as greater than 2 times or greater than three times, the width of the beam 132 at its distal end. The length of the tip 134 (from its connection to the beam to the termination point of the probe needle 130, e.g., in the vertical direction along the axis of the beam 132 and perpendicular to its width) may be in the range of 0.3 to 1.5 times of its width. Continuing on the exemplary structure described above in connection with beam 132, tips 134 having a width wider than the width of the beam 132 at its distal end may have a width of 32 μm or less, such as 24 μm or less, and have a length between 5 μm and 24 μm.

For reference, probe needles of conventional probe cards may have such a structure designed to vertically contact a bump of a semiconductor device. That is, conventional probe cards may be designed to move the probe card vertically relative to the semiconductor device to have the bottom of the probe needle come into contact with a top surface of a corresponding bump of the semiconductor device. As described above, bumps of a semiconductor device may have a height deviation. In such a conventional device, continued vertical movement of the probe card to the semiconductor device may be performed even after one or more of the bumps have made contact with corresponding probe needles to assure that the probe needles come into contact with all the bumps (taking into consideration the height deviation of the bumps). Due to this overdrive, excessive stress may be applied to the probe needles and the bumps and thus the probe needles and the bumps may be permanently deformed or damaged. Accordingly, in the structure of the typical probe card, the conventional probe needles should be carefully designed, and may be formed with a structure or a material capable of overcoming an increase in stress caused by the overdrive and/or be replaced at a higher rate due to mechanical failure. For example, in the structure of the typical probe card, the probe needle may be designed with a very high aspect ratio of a width of several tens of μm to a length of several mm or in a complicated form, such as a spring form, so as to absorb stress. Typical probe cards using such a vertical contact technique may require probe needles to be manually attached one by one due to structural characteristics thereof. Thus, the probe card may be extremely unsatisfactory in terms of productivity and cost. Furthermore, in recent years, as semiconductor devices have been continually downscaled and multifunctional, several thousands of probe needles with very fine pitches are often required. As a result, the probe card may have become more problematic in terms of productivity and mass productivity.

In contrast, the probe card 100 of the present embodiment may adopt the probe needles 130 providing a lateral contact structure, thereby effectively solving problems caused by the typical probe needle having a vertical contact structure. For instance, in the probe card 100 of the present embodiment, since the probe needles 130 are designed to provide lateral contact with the bumps 2200 of the semiconductor device 2000, an overdrive caused by the vertical contact structure may not be needed. Accordingly, in the probe card 100 of the present embodiment, the probe needles 130 may be formed to a relatively small length of several hundred μm or less. As a result, the probe needles 130 or both the probe needles 130 and the support 120 may be formed by using a semiconductor process or a micro-electro-mechanical-system (MEMS) process, thereby greatly increasing productivity and allowing mass productivity of the probe card 100.

In the probe card 100 of the present embodiment, although the probe needles 130 are located directly on the bottom surface of the support 120, a structure of the probe needles 130 is not limited thereto. For example, the probe needles 130 may be formed in an addition support plate, and the support plate may be coupled to the support 120. The probe needles 130 may be located through the support plate, and the support plate may serve to electrically separate the probe needles 130 from one another. In some cases, the support plate may have a hollow structure.

As shown in FIG. 2, the probe card 100 may further include stoppers 140 located on the bottom surface of the support 120 to surround a region in which the probe needles 130 are located. A shape of the stoppers 140 may depend on a shape of the region in which the probe needles 130 are located. For example, when the region in which the probe needles 130 are located has a tetragonal shape, each of the stoppers 140 may have a tetragonal ring shape. Also, each of the stoppers 140 may have a closed ring shape in which the stopper 140 is a continuous open ring shape, or in which several discrete stoppers 140 are regularly provided along a circle (or other geometric shape, such as a square, rectangle, etc.) encompassing the probe needles 130.

As shown in FIG. 2, a width W2 of each of the stoppers 140 may be greater than the width W1 of each of the probe needles 130. For example, the width W2 of each of the stoppers 140 may be at least five times greater than, at least ten times greater than or at least several tens of times greater (e.g., 30 times greater) than the width W1 of each of the probe needles 130. However, the width W2 of each of the stoppers 140 is not limited thereto. A length Ts of each of the stoppers 140 may be greater than the length Tp of each of the probe needles 130. For example, the length Ts of each of the stoppers 140 may be greater than the length Tp of each of the probe needles 130 by 40 μm or less, such as 30 μm or less. Thus, a bottom surface of each of the stoppers 140 may be lower than the tip 134 of each of the probe needles 130 (e.g., when implemented in the orientation shown in FIGS. 1 and 2). The stoppers 140 may include the same material as the probe needles 130 and be formed of the same metal layer. For instance, when the probe needles 130 are formed by using a semiconductor process, the stoppers 140 may be formed together with the probe needles with the same deposition process as described below in further detail with reference to FIGS. 11A to 11F.

In the probe card 100 of the present embodiment, when the semiconductor device 2000 is tested, the stoppers 140 may prevent damage to the probe needles 130 or deformation of the probe needles 130 due to the probe needles 130 contact with a body (refer to 2100 in FIG. 3A) of the semiconductor device 2000. Also, the stoppers 140 may transmit mechanical force to the body 2100 of the semiconductor device 2000 and flatten the body 2100 (e.g., when the body 2100 of the semiconductor device 2000 is warped). Furthermore, the stoppers 140 may be used to measure force transmitted to the body 2100 of the semiconductor device 2000 so that the measured force may assist in aligning the probe card 100 in a vertical direction. For example, one or more piezoelectric sensors may measure a force received by stoppers 140 from body 2100 of the semiconductor device 2000 (such force corresponding to the force applied by stoppers 140 to body 2100 of the semiconductor device 2000. The one or more piezoelectric sensors may be interposed between one or more of stoppers 140 and substrate 122 or be formed as part of stoppers 140 or otherwise be positioned to receive a compressive force transmitted from stoppers 140. Alternatively, use of stoppers 140 with probe card 100 may be avoided. Instead, distances to control vertical spacing of the probe card 100 and the semiconductor device 2000 may be measured by using an optical method.

The tester 200 may include a test head 210 and a test main body 220. The probe card 100 may be mechanically and electrically coupled to the tester 200 by the test head 210. The test main body 220 may generate an electric signal for testing the semiconductor device 2000 and transmit the electric signal to the semiconductor device 2000 through the test head 210 and the probe card 100. Also, the test main body 220 may receive electric signals generated by the semiconductor device 2000 in response to the transmitted electric signals, through the probe card 100 and the test head 210 and determine if the semiconductor device 2000 is defective. The test main body 220 comprise a computer and/or dedicated hardware and/or firmware to generate a series of test signals (test patterns) that are provided to the semiconductor device 2000 to receive and analyze the signals provided by the semiconductor device in response to these tests signals. As the probe card 100 is located between the tester 200 and the semiconductor device 2000 and mediates a test, the probe card 100 may be considered a test interface.

The stage 300 may be an apparatus in which the semiconductor device 2000 as a test target is located. The stage 300 may move in an x direction, a y direction, and a z direction (e.g., an "x-y-z stage"). During a test, the semiconductor device 2000 may be located on the stage 300 and move in the x direction, the y direction, and the z direction due to movement of the stage 300. The stage 300 may an "electrostatic chuck (ESC)", a "support chuck", or a "chuck table."

The semiconductor device 2000, which is a test target, may include a body 2100 and bumps 2200, as shown in FIG. 3A. Bumps 2200 may comprise terminals of the semiconductor device 2000 forming an electrical interface of the semiconductor device 2000 through which electrical signals (e.g., power, timing, command, address and data signals) are transmitted between an integrated circuit formed within the body 2100 of the semiconductor device 2000 and an external device. In this example, each of the bumps 2200 may include a conductive metal pillar 2210 and solder 2220 on a distal end of the metal pillar and forming a tip of the bumps 2200. The solder 2220 may be relatively soft as compared to the metal pillar and thus more easily deform due to an exerted pressure than the metal pillar 2210. Further, the solder 2220 may have a melting point significantly lower than that of the metal pillar 2210, such as 230 degrees Celsius. Such deformation and relatively low melting point of the solder 2220 may be beneficial when later connecting the semiconductor device 2000 to an external signal source (e.g., to a printed circuit board of an electronic system). For example, when solder is used to form the tip 2220 of bumps 2200, the Brinell hardness (HB) may be less than 20, while the metal pillar 2210 may be greater than 100 (e.g., greater than 200 or even greater than 500). For example, the hardness of the metal pillar 2210 may be greater than 5 times, or even greater than 10 times or greater than 20 times the hardness of the tip of the metal pillar 2220 (here solder 2220). In other examples, a material different than solder may be used for the tip of the bumps 2200 and in other examples, a single material may be used to form the bulk of the bumps 2200 (e.g., the metal pillar 2210 described herein may terminate at and form the tip of the bump 2200 without a different metal added thereto (e.g., without solder 2220)). During a test of the semiconductor device 2000, the probe needles 130 of the probe card 100 of the present embodiment may be in contact with side surfaces of the bumps 2200 of the semiconductor device 2000, specifically, side surfaces of the metal pillars 2210. Thus, test signals provided by test main body 220 may be transmitted to the integrated circuit of the semiconductor device 2000 through the side surfaces of the bumps 2200, and resulting signals generated by the semiconductor device 2000 responsive to the test signals may be transmitted to the test main body 220 through side surfaces of the bumps 2200. Such signal transmission may be performed without the probe needles 130 being in contact with top surfaces of the bumps 2200. For example, all or some (e.g., a majority) of the probe needles 130 may not be in contact with solder 2220 during the testing of the semiconductor device 2000.

The semiconductor device 2000 being tested may be integrally formed as part a semiconductor wafer with other semiconductor devices formed as part of the wafer. The additional semiconductor devices may have the same design and structure of the semiconductor device 2000 (e.g., all memory devices to be singulated from the wafer after testing to form memory chips). Further, the probe card 100 may be used as a test interface to simultaneously test more than one semiconductor device 2000 integral to the wafer (e.g., be brought in contact with the bumps 2200 of more than one semiconductor device 2000 integral to the wafer) or may be used to test such wafer-level semiconductor devices 2000 one-by-one sequentially. In some examples, the semiconductor device 2000 may be tested after being packaged (fully or partly) in a semiconductor package. It will be appreciated that the invention may also be applied to the testing of semiconductor packages (i.e., the semiconductor device may be a semiconductor package of encapsulating one or more semiconductor chips), although the small pitch and accuracy provided by the invention may not be fully utilized in testing semiconductor packages (since semiconductor packages typically provide terminals having larger size and pitch than those provided of the semiconductor chips which they package).

After the test, the semiconductor device 2000 may be identified as a non-defective unit or a defective unit through a determination made by the test main body 220. If the semiconductor device 2000 is identified as a non-defective unit, additional manufacturing processes may be performed. Otherwise, if the semiconductor device is identified as a defective unit, the defective unit may be discarded, repaired or used for other purposes (e.g., the defective semiconductor device 2000 may be cut from the wafer in an integral unit with one or more non-defective semiconductor devices and used to provide various connections in a subsequent packaging process by drilling substrate-through vias through the defective semiconductor device 2000). Exemplary subsequent processes that may be performed on the tested semiconductor device 2000 will be described below in further detail with reference to FIG. 10.

Figure 3B:
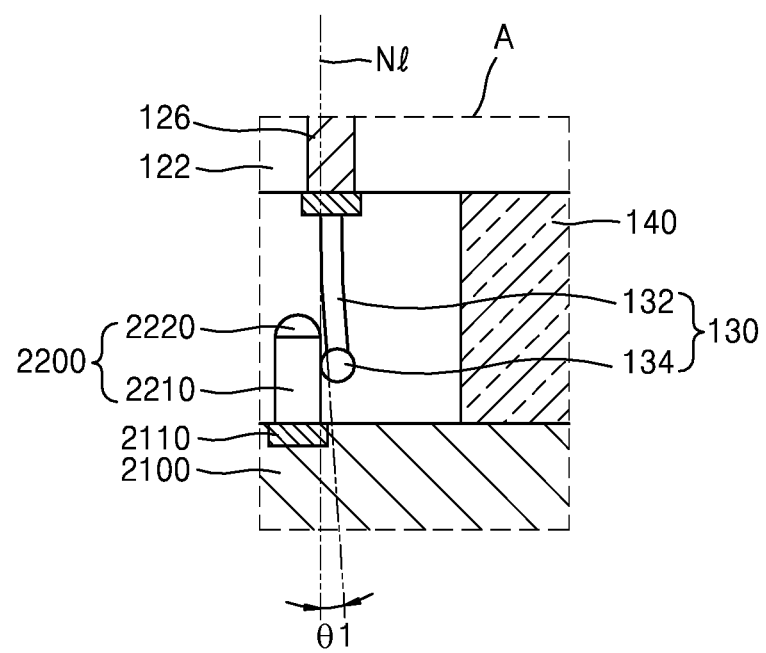
FIG. 3B is an enlarged cross-sectional view of a square region A illustrated with a dashed line in FIG. 3A.

FIG. 3A is a conceptual diagram illustrating principles by which a semiconductor device is tested by using the probe card 100 of FIG. 2. FIG. 3B is an enlarged cross-sectional view of a square region A illustrated with a dashed line in FIG. 3A.

Referring to FIGS. 3A and 3B, a plurality of bumps 2200 may be provided on a semiconductor device 2000, which is a test target. Each of the bumps 2200 may include a metal pillar 2210 and a solder 2220 located on the metal pillar 2210. The metal pillar 2210 may be, for example, a copper pillar, or other conductive metal or conductive material. As shown in FIG. 3A, the bumps 2200 may have different heights. It will be appreciated that reference to heights of the bumps 2200 refers to position of the tips of the bumps in the vertical direction rather than referring to the vertical length of the bumps 2200. As shown in FIG. 3A, the position of distal ends of bumps 2200 deviate in the vertical direction. Here, $\triangle h$ may refer to a height difference between a bump having the greatest height and a bump having the smallest height. Height deviation of the bumps 2200 may occur due to a variety of factors, such as length differences between bumps, or because the body 2100 is bent or the semiconductor device 2000 is inclined on the stage (e.g., stage 300 in FIG. 1).

The semiconductor device 2000 may be located on the stage (refer to 300 in FIG. 1) of the test apparatus (refer to 1000 in FIG. 1), and the probe card 100 may be located over the semiconductor device 2000. As shown in the upper portion of FIG. 3A, the probe card 100 may have the same structure as described elsewhere herein, such as with reference to FIG. 2. The probe needles 130 of the probe card 100 and the bumps 2200 may be moved closer to each other so that each of the probe needles 130 are positioned adjacent to a corresponding one of the bumps 2200 of the semiconductor device 2000.

After the probe needles 130 are positioned adjacent to the bumps 2200 of the semiconductor device 2000, the probe needles 130 of the probe card 100 may be brought into contact with the side surfaces of the bumps 2200 of the semiconductor device 2000, so that an electrical test may be performed on the semiconductor device 2000. In this example, the tips 134 of the probe needles 130 may be brought into contact with the side surfaces of the metal pillars 2210 of the bumps 2200. The positioning of the probe needles 130 adjacent to the bumps 2200 and the contacting of the tips 134 of the probe needles 130 with the metal pillars 2210 of the bumps 2200 will be described below in further detail with reference to FIGS. 8A to 9C. It should be appreciated that not all of the bumps 2200 of the semiconductor device 2000 may require contact with a probe needle 130 (e.g., dummy bumps of the semiconductor device 2000 may not participate in testing using the probe card). Similarly, some probe needles 130 may not participate in testing and need not be brought into contact with a corresponding bump 2200).

As shown in FIG. 3B, when the tip 134 of the probe needle 130 comes into contact with the side surface of the metal pillar 2210 of the bump 2200, the stopper 140 may also be in contact with the body 2100 of the semiconductor device 2000. For example, when the body 2100 of the semiconductor device 2000 is bent, the stopper 140 may contact the body 2100 and apply force to the body 2100 downward so that the body 2100 may be flattened to some extent. Meanwhile, when the body 2100 of the semiconductor device 2000 is flat, the stopper 140 may be in contact with the body 2100 of the semiconductor device 2000 or be spaced apart from the body 2100. Although FIG. 3B (and FIG. 5C) illustrate situations where beam 132 is not in contact with the bump 2200, in some examples the beam 132 may make contact with the bump 2200, such as in addition to the contact of the tip 134 to the side surface of the bump 2200 shown in FIG. 3B (and FIG. 5C) and/or when tip 134 is not provided with probe needle 130. For example, the beam 132 may contact the solder 2220 of the bump 2200 and/or an upper portion of the metal pillar 2210 of the bump.

Furthermore, as shown in FIG. 3B, when the tip 134 of the probe needle 130 is in contact with a side surface of the metal pillar 2210, the beam 132 of the probe needle 130 may be bent at a first angle θ1 with respect to a normal line N1 that is perpendicular to the bottom surface of the substrate 122 of the support 120. Here, the first angle θ1 may the angle between the normal line N1 and a straight line aligned with the side surface of the beam 132 at the distal end of the beam 132 (near the connection of the beam 132 to the tip 134). In this example, the side surface of the beam 132 at the distal end of the beam 132 is aligned with the normal line N1 when the probe needle is not receiving an external force (the resting position of the probe needle 130) and thus the first angle θ1 represents an angular deviation of the side surface of the beam 132 at the distal end of the beam 132 due to the force received from bump 2200. The first angle θ1 may be at least 3°, at least 5° or even more than 10°. The probe needle 130 may be bent due to pressure on the tip 134 of the probe needle 130 received from the side surface of the beam 132. Stress caused by the bending of the probe needle 130 may contribute toward tightly bringing the tip 134 of the probe needle 130 into contact with the side surface of the metal pillar 2210 and reducing contact resistance. However, to prevent the probe needle 130 from being deformed or damaged, the probe needle 130 may be bent, with forces applied to the probe needle 130 limited to those within an elastic region of the probe needle (e.g., having a force less than the yield strength of the probe needle 130). The probe needle 130 may thus comprise a leaf spring, which applies and receives a force from the metal pillar 2210 corresponding to the horizontal displacement of the tip 134 of the probe needle from its resting location (e.g., with respect to the base of the probe needle 130), and may return to its resting shape after disengaging the metal pillar 2210 (where resting refers to the location and shape of the probe needle 130 when it is not receiving an external force). In other examples, the probe needle 130 may not be formed to provide any significant bending and/or rotational motion. For example, the probe needle 130 may rotate without substantial bending, such as rotating about its base 136. In addition, the distal end of the probe needle 130 may rotate due to both bending of the probe needle 130 and due to rotation of the probe needle about its base 136 (such rotation may also occur with a horizontal displacement, as shown in FIG. 3B).

Figure 4A:
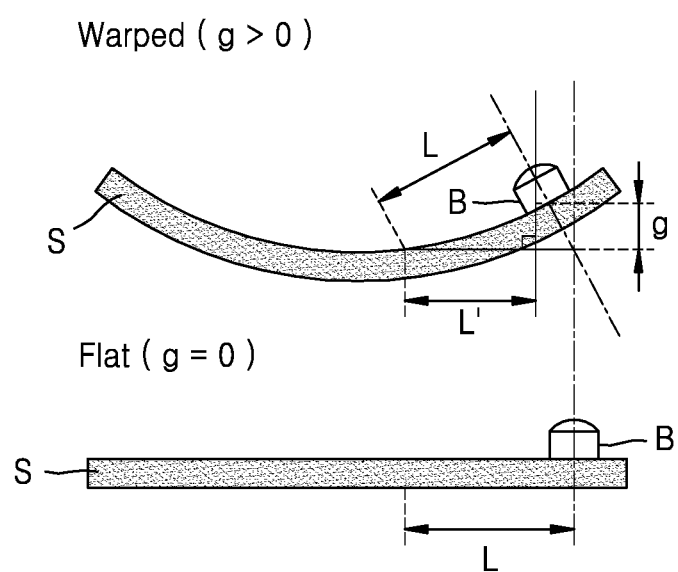
FIG. 4A is a conceptual diagram showing a height of a bump and a lateral distance relative to the bending of a substrate.
Figure 4B:
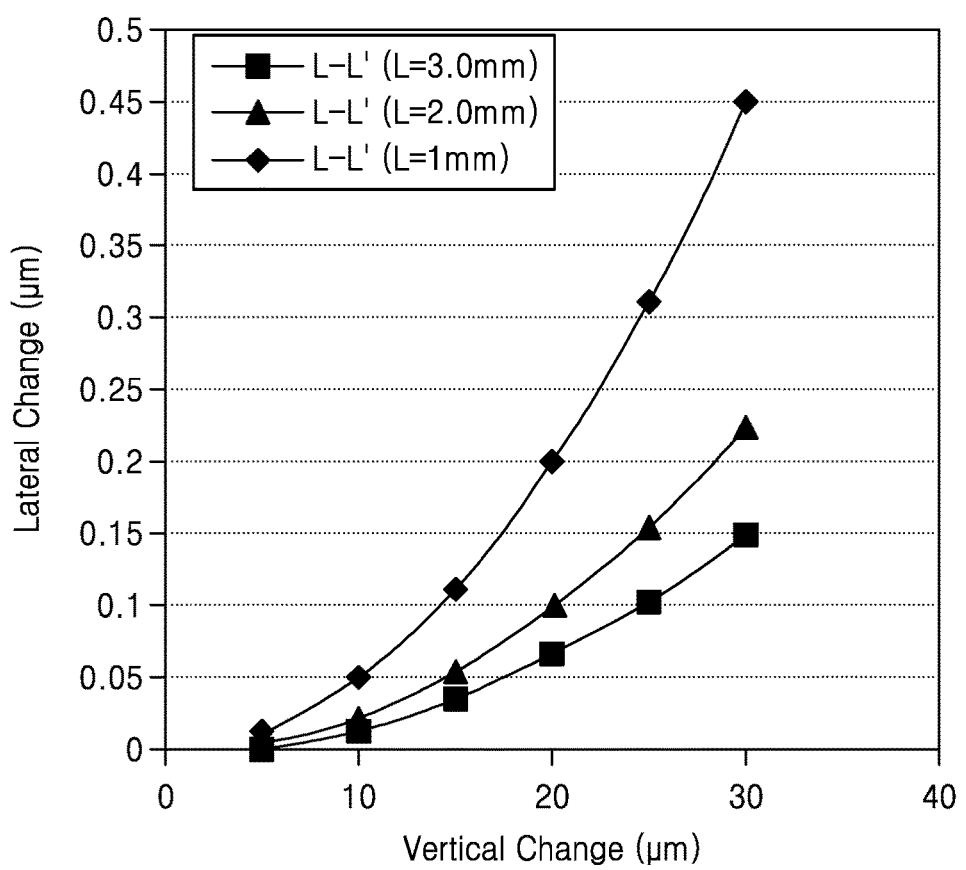
FIG. 4B is a mathematically quantitated graph of a lateral distance relative to a height of a bump.

FIG. 4A is a conceptual diagram showing a height of a bump B and a lateral distance relative to the curvature of a substrate S, and FIG. 4B is a mathematically quantitated graph of a lateral distance change relative to a height change of a bump. In FIG. 4A, the lower drawing shows a state in which the substrate S is flat, while the upper drawing shows a state in which the substrate S is curved.

Referring to FIG. 4A, as can be seen from the lower drawing, when the substrate S is flat, that is, when the substrate S is not bent or curved, it may be assumed that a horizontal distance from a reference position to the bump B is L and a height of a top surface of the substrate S or a height of a bottom surface of the bump B is 0. As can be seen from the upper drawing, when the substrate S is bent and a change in the height of the top surface of the substrate S is "g", a change in height of the bump B in a vertical direction may also be almost "g". Next, when the substrate S is bent, assuming that a horizontal distance from the reference position to the bump B is L', a change (i.e., L-L') in horizontal distance of the bump B may be approximated as shown in Equation (1), $$L-L' \approx L-(L^2-g^2)^{1/2} \qquad (1).$$

Specific numerical values of a positional change of the bump B in a horizontal direction will now be calculated. For example, assuming that a horizontal distance L to the bump B is about 2 mm when the substrate S is flat, and a height change "g" is about 50 μm when the substrate S is bent, a change in the horizontal distance L to the bump B may be about 0.63 μm using Equation (1). In view of the fact that a height change "g" caused by the bending of the substrate S is generally about 30 μm or less, a change in the horizontal distance L to the bump B may be about 0.5 μm or less. Accordingly, it can be seen that the change in the horizontal distance L to the bump B is very slight as compared with the height change "g" of the bump B. In addition, a height deviation of the bump B may be considered together to calculate height differences between the bumps B. However, since the height differences between the bumps B are typically several μm or less and hardly affect a change in the horizontal distance L to the bump B, consideration of the height differences between the bumps B may be omitted.

Referring to FIG. 4B, when horizontal distances L to the bump B were about 3.0 mm, about 2.0 mm, and about 1 mm, respectively, values of changes in lateral distance (i.e., horizontal distance) to the bump B relative to a vertical height change of the bump B were calculated using Equation (1) and represented graphically. As described above, it can be confirmed that even if a height change of the bump B was about several tens of μm, a change in lateral distance to the bump B had a very slight value of about 0.5 μm or less.

Thus, when a semiconductor device is tested by a lateral contact method using the probe card 100 of the present embodiment, a lateral contact of the probe needle 130 with the bump 2200 may be performed by a lateral displacement of only several μm. For example, the lateral displacement may include a typical displacement of about 1 to 2 μm due to a lateral position precision, a displacement of about 0.5 μm or less due to lateral distortion caused by the warpage of a substrate, and a minimum displacement applied in a lateral direction to reduce contact resistance.

For reference, when a semiconductor device is tested by a vertical contact method using a conventional probe card, a vertical displacement of about 50 μm or more may be typically required in view of a height displacement of several tens of μm due to the warpage of a substrate, a displacement due to a height position manufacturing processing precision, and a displacement applied in a vertical direction to reduce contact resistance. Accordingly, an overdrive may be needed in a vertical direction, and probe needles may be manufactured to a length of several mm or in complicated forms, such as vertically compressive springs.

Figure 5A:
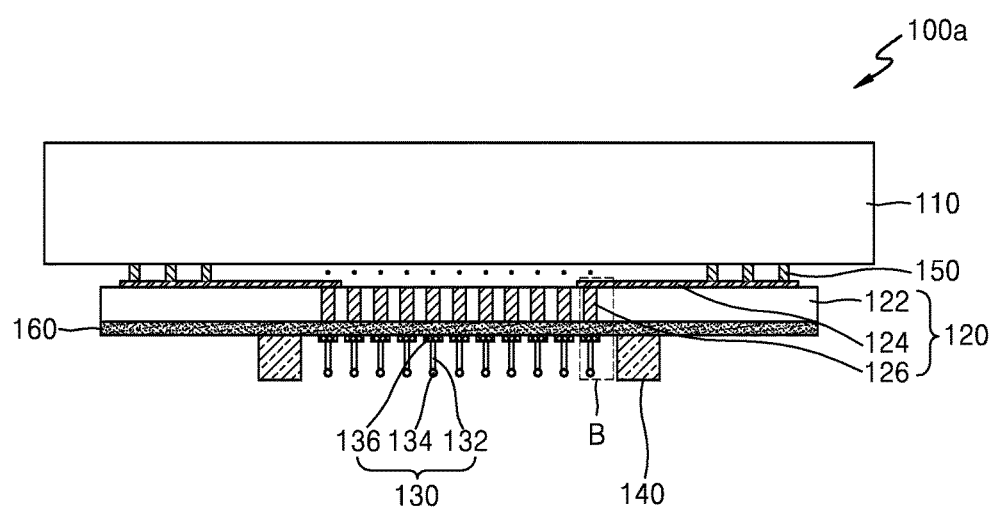
FIG. 5A is a cross-sectional view of a probe card according to an embodiment.
Figure 5B:
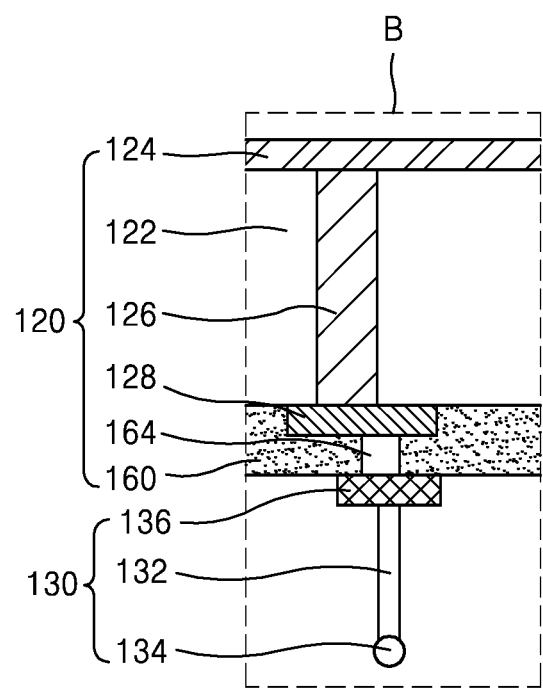
FIG. 5B is an enlarged cross-sectional view of a rectangular region B illustrated with a dashed line in FIG. 5A.
Figure 5C:
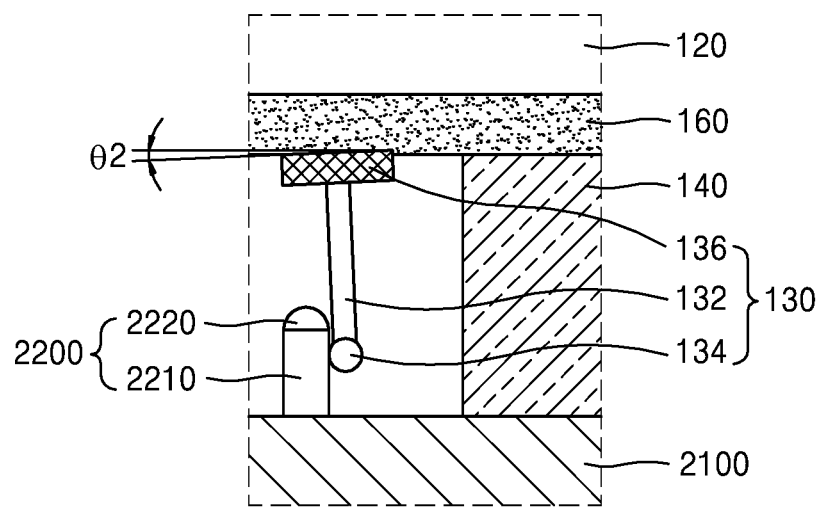
FIG. 5C is a cross-sectional view of a shape of the probe card when a semiconductor device is tested by using the probe card of FIG. 5A.

FIG. 5A is a cross-sectional view of a probe card 100a according to an embodiment. FIG. 5B is an enlarged cross-sectional view of a rectangular region B illustrated with a dashed line in FIG. 5A. FIG. 5C is a cross-sectional view of a shape of the probe card 100a when a semiconductor device is tested by using the probe card 100a of FIG. 5A. Reference numerals that are the same as those described above represent the same structure as described above (e.g., with respect to FIGS. 1 and 2) and repetitive description will be simplified or omitted for brevity.

Referring to FIGS. 5A to 5C, the probe card 100a of the present embodiment may differ from the probe card 100 of FIG. 2 in that the probe card 100a of the present embodiment further includes a stress absorption layer 160. Specifically, in the probe card 100a of the present embodiment, support 120 includes a stress absorption layer 160 positioned between the substrate 122 and probe needles 130. The probe needles 130 may be located on the stress absorption layer 160 and electrically connected to the contact pads 128 of the support 120 through the vertical contacts 164. Needle bases 136 of the probe needles 130 may be formed on a bottom surface of the stress absorption layer 160 (as shown) or within stress absorption layer 160. Vertical contacts 164 may extend vertically between corresponding pairs of the contact pads 128 and the needle bases 136 to electrically connect the same. In some embodiments, contact pads 128 may be omitted, and in some embodiments both contact pads 128 and vertical contacts 164 may be omitted (for example, stress absorption layer 160 may be formed to surround ends of through vias 126 that are formed to protrude from the lower surface of substrate 122 and needle base 136 may be formed in contact with a bottom end of the through vias 126 in the same manner as it is connected to the bottom end of vertical contacts 164 as shown in FIG. 5B).

The stress absorption layer 160 may include an elastic material capable of absorbing stress. For example, the stress absorption layer 160 may include and/or be an organic material, such as a polymer with elasticity, such as epoxy or polyimide, and/or an elastic material, such as silicone. Thus, the stress absorption layer 160 may be compressive and/or stretchable to absorb stress applied to the probe needles 130.

When a first portion of the stress absorption layer 160 has a compressive force is applied, the first portion may be compressed in its height (i.e., the thickness of the stress absorption layer 160 may have its thickness reduced at the first portion). The elasticity of the stress absorption layer 160 may cause the shape of the stress absorption layer 160 to return to its previous non-compressed state (e.g., the thickness of the stress absorption layer may return to its original thickness prior to receiving the compressive force). In some examples, the stress absorption layer 160 may be stretchable, so that upon receiving a tensile force (e.g., a force pulling downward on a bottom surface of the stress absorption layer 160), the portion of the stress absorption layer 160 receiving the tensile force may have its thickness increased, with the elasticity of the stress absorption layer 160 acting to cause the stress absorption layer 160 to return to its original shape.

More specifically, as described above with reference to FIG. 3B, when the probe needle 130 is brought into contact with the side surface of the metal pillar 2210 of bump 2200, the beam 132 of the probe needle 130 may be bent with respect to the normal line N1 that is perpendicular to the bottom surface of the substrate 122, causing stress to be applied to the probe needle 130. As can be seen from FIG. 5C, the reactive force applied by the bump 2200 to the probe needle 130 provides a torque (a rotational force) to the probe needle 130 causing the needle base 136 to rotate so that it obtains an inclination of a second angle θ2 with respect to its original position (without external forces applied). In this example, the second angle θ2 is measured with respect to the change in the orientation of the surface of the base 136 (in this example, the initial orientation of the surface of the base 136—prior to the probe needle 130 receiving a force from the bump 2200—is aligned with the lower surface of the stress absorption layer 160). Rotation of the needle base 136 may be at least 3°, at least 5° or even more than 10° depending on the design and/or operation of the probe card 100. Thus, the second angle θ2 may be at least 3°, at least 5° or even more than 10°. Accordingly, part of force applied to the probe needle 130 may be absorbed into or otherwise compensated by the stress absorption layer 160 so that stress applied to the probe needle 130 may be reduced.

As described above, when stress applied to the probe needle 130 deviates from an elastic region of the probe needle 130, the probe needle 130 may be deformed or damaged. However, when the probe card 100a of the present embodiment includes the stress absorption layer 160, stress applied to the probe needle 130 may be reduced, thereby effectively preventing permanent deformation of the probe needle 130 or damage to the probe needle 130. Rotation of the base 136 of the probe needle 130 may be facilitated by the compression and/or expansion of the stress absorption layer 160, thereby reducing the bending of the probe needle 130. As such, the tip 134 of the probe needle 130 may be moved further horizontally with respect to the base 136 of the probe needle 130 to assure contact of tips 134 of multiple probe needles 130 (which may have different horizontal spacings from corresponding bumps 2200 prior to contact) while avoiding applying stresses past the yield strength of any of the probe needles 130.

FIGS. 6A to 6D are cross-sectional views of probe cards adopting probe needles having various shapes, according to embodiments. Repetitive descriptions of the same elements set forth elsewhere herein may be simplified or omitted for brevity.

Figure 6A:
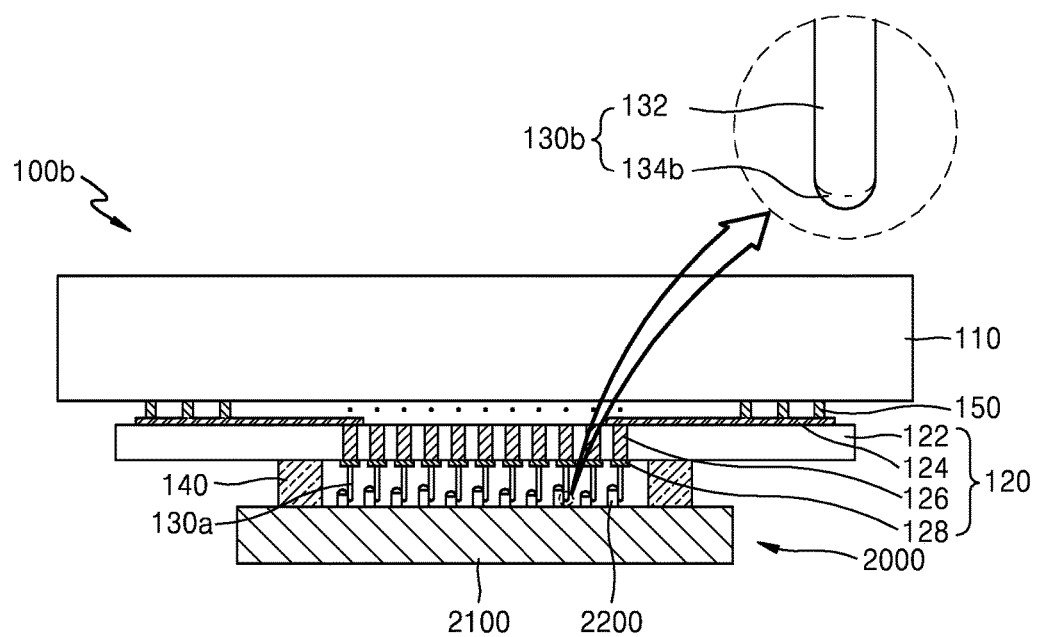
FIGS. 6A to 6D are cross-sectional views of probe cards adopting probe needles having various shapes, according to embodiments.

Referring to FIG. 6A, in a probe card 100b of the present embodiment, a probe needle 130b may not have an enlarged structure (as compared to the beam portion connected thereto) at an end of the beam 132, or may not have a structure that protrudes from a side surface of the beam 132. Thus, a portion of an end of the beam 132 of the probe needle 130*b* may form a tip 134*b* of the probe needle 130*b*. The probe needle 130*b* may have the same width over the entire length or taper downward in a continuous, smooth manner. Although FIG. 6A illustrates an example in which the end of the probe needle 130*b* has a curved shape, a shape of the end of the probe needle 130*b* is not limited thereto. For example, the end of the probe needle 130*b* may have a sectional shape or a horn shape.

In the probe card 100*b* of the present embodiment, as shown in FIG. 6A, a side surface of the probe needle 130*b* may be brought into contact with a side surface of a bump 2200. The side surface of bump 2200 which is contacted by the probe needle 130*b* may be a side surface of a metal pillar 2210. The probe needle 130*b* may not be bent with respect to a normal line perpendicular to a bottom surface of a substrate 122. In some embodiments, the probe needle 130*b* may be bent and/or rotated with respect to the normal line perpendicular to the bottom surface of the substrate 122 as described herein.

In addition, the probe card 100*b* of the embodiment of FIG. 6A may include a stress absorption layer such as described with respect to FIGS. 5A, 5B and 5C. Similarly, each of probe cards 100*c*, 100*d*, and 100*e* of FIGS. 6B to 6D also may include such a stress absorption layer.

Figure 6B:
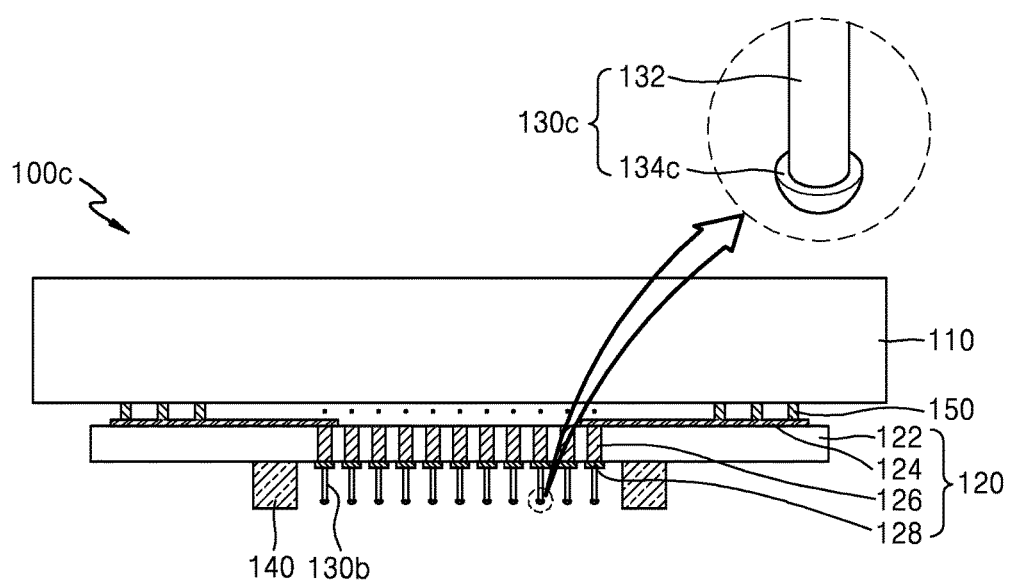

Referring to FIG. 6B, in the probe card 100*c* of the present embodiment, a probe needle 130*c* may include a substantially hemispherical tip 134*c*. The substantially hemispherical tip 134*c* of the probe needle 130*c* may come into contact with a side surface of a metal pillar 2210 of a bump 2200. Also, the probe needle 130*c* may be bent and/or rotated with respect to a normal line perpendicular to a bottom surface of a substrate 122 as described herein. Here, a substantially hemispherical shape may comprise part of a rounded shape, such as part of a hemisphere, ovoid or ellipsoid or similar structures.

Figure 6C:
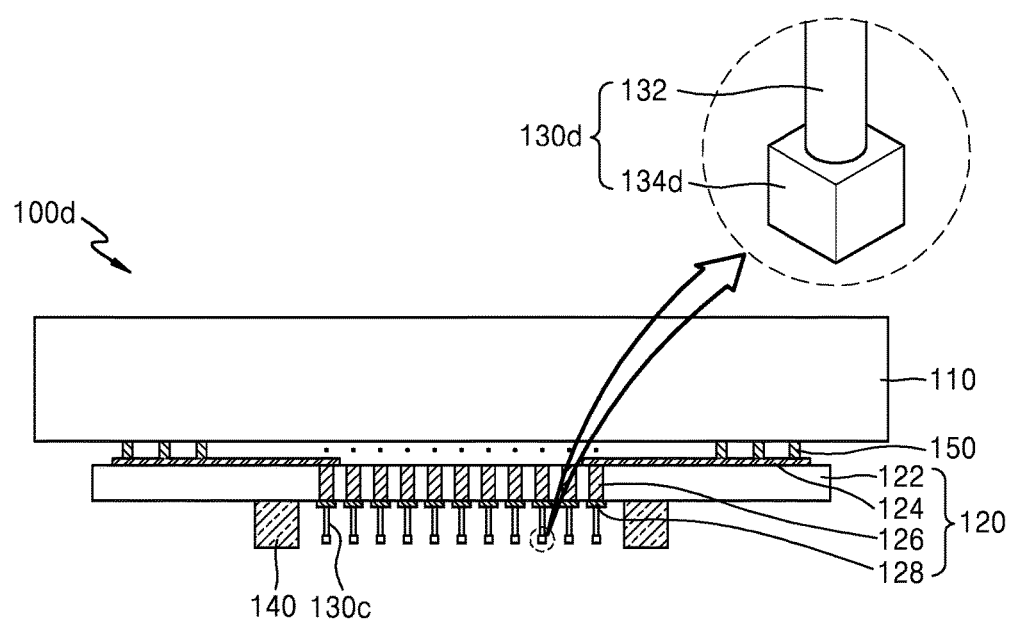

Referring to FIG. 6C, in the probe card 100*d* of the present embodiment, a probe needle 130*d* may include a square-pillar-type tip 134*d* such as being formed substantially as a rectangular parallelepiped. One facet of the square-pillar-type tip 134*d* of the probe needle 130*d* may come into contact with a side surface of a metal pillar 2210 of a bump 2200. Also, the probe needle 130*d* may be bent and/or rotated as described herein with respect to a normal line perpendicular to a bottom surface of a substrate 122.

In the probe card 100*d* of the present embodiment, the probe needle 130*d* is not limited to the square-pillar-type tip 134*d* but may include one of tips having various other polygonal pillar shapes. For example, the probe needle 130*d* may include a triangular-pillar-type tip or a pentagonal-pillar-type tip.

Figure 6D:
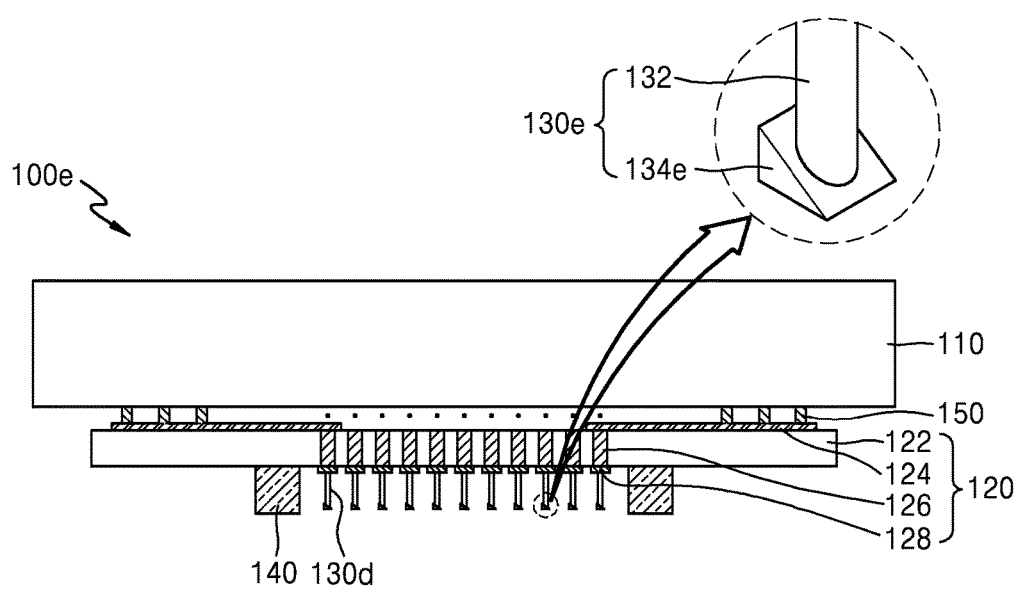

Referring to FIG. 6D, in the probe card 100*e* of the present embodiment, a probe needle 130*e* may include a polyhedral tip 134*e*. For example, a polyhedron may have a shape obtained by cutting a rectangular parallelepiped along a diagonal line of any one facet of the rectangular parallelepiped. One facet of the polyhedral tip 134*e* of the probe needle 130*e* may be in contact with a side surface of a metal pillar 2210 of a bump 2200. Also, the probe needle 130*e* may be bent and/or rotated with respect to a normal line perpendicular to a bottom surface of a substrate 122 as described herein.

In the probe card 100*e* of the present embodiment, the probe needle 130*e* is not limited to the polyhedral tip 134*e* shown in FIG. 6D but may include one of tips having various other polyhedral shapes. Also, the probe needle 130*e* may include a polyhedral tip having a triangular pyramid shape or a quadrangular pyramid shape.

Thus far, probe cards including probe needles having various shapes have been described with reference to several embodiments. However, shapes of the probe needles included in the probe cards according to the present embodiments are not limited to the described examples. For example, in the probe cards of the present embodiments, in addition to the described examples of the tips, the probe needles may include any and all tips that protrude from the side surfaces of the beams 132 and are capable of easily contacting the side surfaces of the metal pillars 2210. In some examples, the probe needles 130 may have an "L" shaped profile at the distal end of the probe needles where the beam 132 transitions to tip 134. With respect to side view, one side of the probe needle 130 at its distal end may not have a laterally projecting portion while the opposite side may include a laterally projecting portion (e.g., forming the tip 134).

Figure 12A:
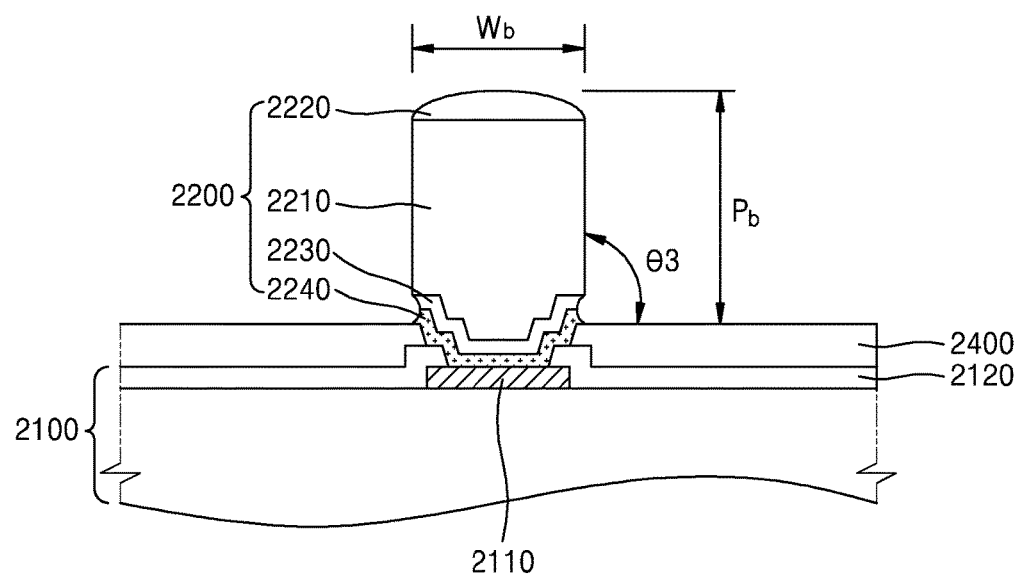
FIGS. 12A to 12C illustrate various details of the semiconductor devices that may be manufactured according to the embodiments described herein.
Figure 12B:
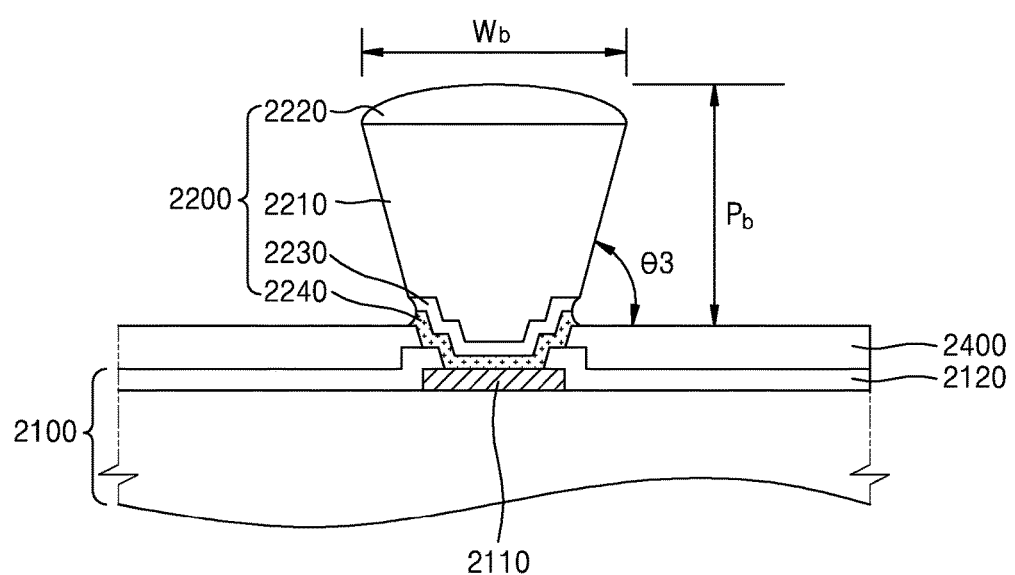
Figure 12C:
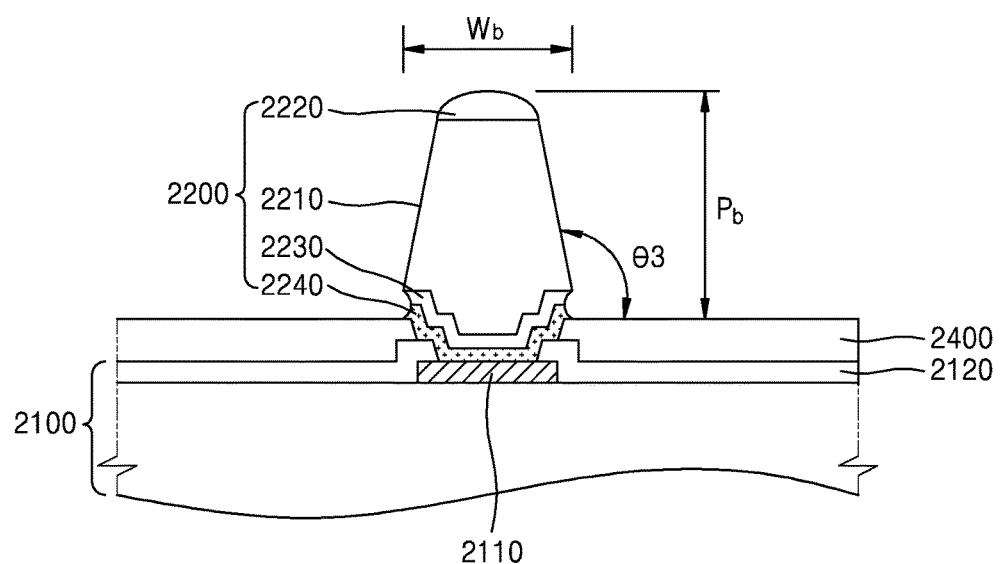

FIGS. 12A, 12B and 12C illustrate various examples of bumps 2200 of semiconductor device 2000 and exemplary physical and electrical connections to the body 2100 of the semiconductor device 2000. As shown in FIG. 12A, the sidewalls of the metal pillar 2210 are substantially vertical forming a substantially perpendicular angle with the top surface of the semiconductor device body 2100 (i.e., sidewalls of the metal pillar 2210 and the top surface of the semiconductor device body 2100 forming a third angle θ3 in a range of 85° to 95°). FIGS. 12B and 12C illustrate examples of metal pillars 2210 having obliquely angled sidewalls, with FIG. 12B illustrating an example of the metal pillar 2210 forming an overhang with respect to the semiconductor device body 2100 (e.g., sidewalls of the metal pillar 2210 and the top surface of the semiconductor device body 2100 forming a third angle θ3 in a range of 95° to 110°) and FIG. 12C illustrating an example of the metal pillar 2210 sloping inwardly towards the top of the metal pillar 2210 (e.g., sidewalls of the metal pillar 2210 and the top surface of the semiconductor device body 2100 forming a third angle θ3 in a range of 70° to 85°). For example, the angle that the sidewall of the metal pillar forms with the top surface of the semiconductor device body 2100 may range from 70° to 110°.

By contacting side surfaces of bumps 2200 during testing as described herein, a vertical force (e.g., extending in a direction of the axis of beam 132) may be substantially reduced, thereby avoiding a complicated design of the probe needles 130 and/or other structure of the probe cards 100. For example, during contact of the probe needle 130 to a side surface of the bumps 2200, the vertical component of force exerted on the probe needle may be less than 50% (e.g., less than 20%) of the horizontal component of the force exerted on the probe needle, (even when the side surfaces of the bumps 2200 are not substantially vertical, such as described with respect to FIGS. 12B and 12C). If the vertical component of the force exerted on the probe needle 130 during contact exceeds a threshold, the tip of the probe needle may slide along the side surface to reduce the vertical component of the force.

In the examples of FIGS. 12A, 12B and 12C, the metal pillar 2210 is electrically connected to chip pad 2110 through a seed layer 2230 (e.g., copper or nickel) and a barrier layer 2240 (e.g., Ti or TiW). The barrier layer 2240 is in contact with chip pad 2110 through an opening formed in passivation layer 2120 (e.g., an insulating layer forming an upper surface of semiconductor device body 2100). Additional layers may be provided, such as a resin layer 2400 which may be formed during the formation of the bump 2200.

The vertical protrusion Pb of the bumps 2200 (the vertical distance the bump 2200 extends above the uppermost surface of the remainder of the semiconductor device 2000, here, above the surface of resin layer 2400) may be larger than the widths Wb of the bumps 2200. For example, the vertical protrusion Pb of bump 2200 may be at least two (2) times than its maximum width Wb, such as at least three (3) times than its maximum width Wb (of course, lower height to width ratios may also be implemented). By extending the vertical protrusion Pb of the bump 2200, warpage of the semiconductor device 2000 may be better accommodated. For example, warpage of the semiconductor device 2000 may cause a deviation of 20 μm or more in vertical location of bumps 2200 (as compared to a non-warped semiconductor device 2000). By providing a vertical protrusion Pb of the bumps of greater than 30 μm, such as between 30 μm and greater 40 μm, the tips 134 of the probe needles 130 may contact sidewalls of the bumps 2200 even when the semiconductor device 2000 is warped. For example, tips of 134 of all the probe needles 130 may contact side surfaces of the corresponding bumps 2200 at locations vertically spaced from the uppermost surface of the remainder of the semiconductor device 2000 (resin layer 2400 in FIGS. 12A-12C) by a distance between 20% to 80% of the vertical protrusion Pb according to the embodiments described herein. For example, contact of a probe needle and a bump may be vertically spaced away from the tip of the bump 2200 at least ⅓ (such as greater than ½) of the vertical protrusion distance. Warpage of the semiconductor device 2000 causing a deviation of the vertical location of the bumps even greater than 20 μm may be accommodated (e.g., 30 μm), such as by use of stoppers 140 to reduce warpage during testing by applying a force to the semiconductor device (e.g., the upper surface of the body 2100 of the semiconductor device 2000) to reduce the warpage and make the semiconductor device 2000 flatter.

Contact between the probe needles 130 and bumps 2200 may thus be assured even when pitches of the bumps 2200 and thus spacing between adjacent bumps is made small. For example, pitch of the bumps 2200 may be 55 μm or less, or less than 30 μm or even less than 20 μm (which may be implemented in the embodiments described herein).

Figure 7:
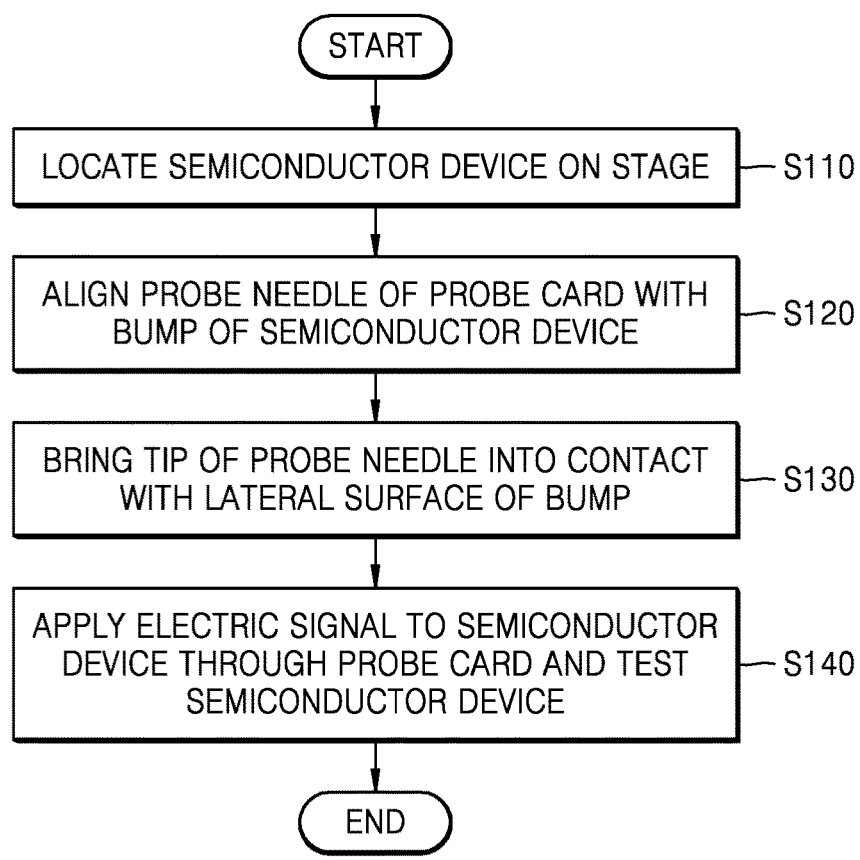
FIG. 7 is a schematic flowchart of a method of testing a semiconductor device by using a probe card according to an embodiment.

FIG. 7 is a schematic flowchart of a method of testing a semiconductor device 2000 by using a probe card according to an embodiment. The flowchart of FIG. 7 will be described with reference to FIGS. 1 and 2. Although the method of FIG. 7 is generally described with respect to one probe needle making contact with one corresponding bump 2200, it should be apparent that FIG. 7 is applicable to plural (e.g., all) probe needles of the probe card, which may be moved together to be brought into contact with respective bumps 2200 of the semiconductor device 2000 in the same operation.

Referring to FIG. 7, to begin with, the semiconductor device 2000, which is a test target, may be located on a stage 300 of a test apparatus 1000 (S110). The semiconductor device 2000 may be, for example, a wafer-level semiconductor device as described with reference to FIGS. 1 and 2 or an individual package-level semiconductor device. A plurality of bumps 2200 may be provided with the semiconductor device 2000. For example, each of the bumps 2200 may include a metal pillar 2210 and a solder 2220.

Figure 8A:
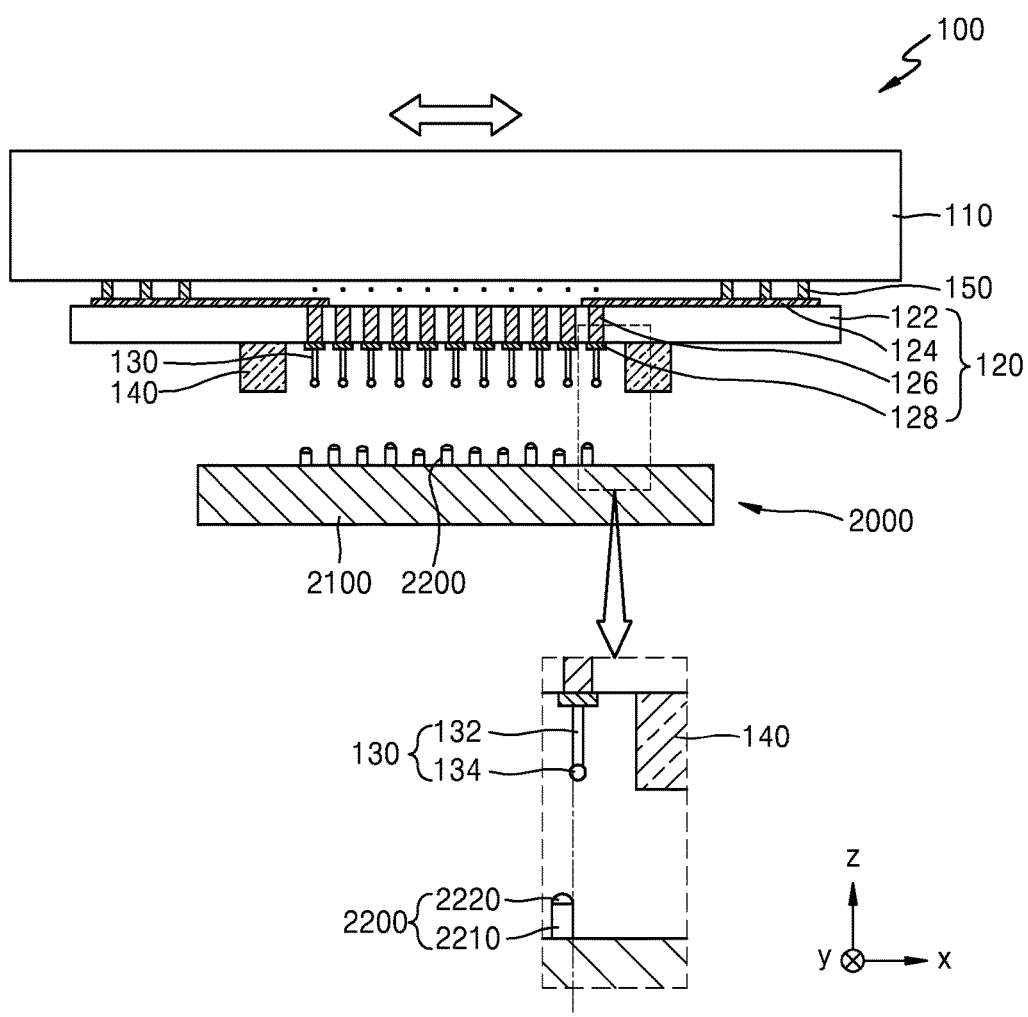
FIGS. 8A to 8C are cross-sectional views corresponding to main operations of the method of testing the semiconductor device of FIG. 7, according to an embodiment.

Next, a probe needle 130 of a probe card 100 may be aligned with a corresponding bump 2200 of the semiconductor device 2000 (S120). Here, the alignment may comprises aligning the probe needle 130 with the bump 2200 so that the tip 134 of the probe needle 130 has a desired location in a horizontal plane with respect to the location of the corresponding bump 2200. For example, with respect to a top down view, the tip 134 of the probe needle 130 may be positioned to be located above the corresponding bump 2200 (the target for contact), or to be between the corresponding bump 2200 and an immediately neighboring bump of the corresponding bump 2200 (i.e., positioned between two bumps 2200) although it will be apparent that such positioning may not apply to certain outermost bumps of an array of the bumps 2200. Also, such alignment may result in the probe needle 130 partially overlapping the corresponding bump 2200 in the vertical direction or where the probe needle 130 does not overlap the corresponding bump 2200 in the vertical direction. This initial alignment of step S120 may result in the tip 134 of probe needle 130 being positioned at a location higher than the bumps 2200 (e.g., as shown in FIG. 8A).

The alignment of the probe needle 130 with the bump 2200 may occur by moving the probe card 100 or by moving the semiconductor device 2000 by moving the stage 300. Here, the movement comprise movement of the probe card 100 and/or the semiconductor device 2000 on an x-y plane for the horizontal alignment. However, in some embodiments, the movement may include rotation of the probe card 100 and/or the semiconductor device 2000 about a z-axis and/or movement in a vertical direction. The alignment of the probe needle 130 with the bump 2200 will be described below in further detail with reference to FIGS. 8A and 9A.

After the probe needle 130 is initially aligned with the bump 2200 in step S120, the tip 134 of the probe needle 130 may be brought into contact with a side surface of the bump 2200, such as a side surface of the metal pillar 2210 (S130). The contact of the tip 134 of the probe needle 130 with the side surface of the metal pillar 2210 may occur by moving the probe card 100 and/or moving the semiconductor device 2000 by moving the stage 300. Here, the movement may include vertical movement as well as horizontal movement of the probe card 100 and/or the semiconductor device 2000. For example, such relative movement may be a linear movement, such as along an oblique line with respect to z-axis. The movement may include movement of the probe card 100 and/or the semiconductor device 2000 downwardly and sideways. In some examples, the movement may only be a relative vertical movement of the probe card 100 and the semiconductor device 2000. The contact of the tip 134 of the probe needle 130 with the side surface of the metal pillar 2210 will be described below in further detail with reference to FIGS. 8B, 8C, 9B, and 9C.

After the tip 134 of the probe needle 130 is brought into contact with the side surface of the metal pillar 2210, the tester 200 may apply an electric signal to the semiconductor device 2000 through the probe card 100 and test the semiconductor device 2000 (S140). Specifically, the test main body 220 may generate electric signals for testing the semiconductor device 2000 and apply the electric signals to the semiconductor device 2000 through the test head 210 and the probe card 100. Also, the test main body 220 may receive a signal, which is generated by the semiconductor device 2000 in response to the applied electric signal, through the probe card 100 and the test head 210 and determine if the semiconductor device 2000 is defective or operable.

The method of testing the semiconductor device according to the present embodiment may include testing the semiconductor device 2000 by bringing the probe needle 130 of the probe card 100 into contact with the side surface of the bump 2200 of the semiconductor device 2000. As a result, the semiconductor device 2000 may be tested with high contact reliability and low contact resistance.

In addition, the method of testing the semiconductor device according to the present embodiment may be performed by using the probe cards 100 described herein. The probe cards 100 may include probe needles having much smaller lengths than typical probe cards. Thus, the probe cards 100 may perform a rapid, stable, and reliable test on the semiconductor device 2000. Furthermore, each of the probe cards 100 may further include the stopper 140 and/or the stress absorption layer 160, which may serve to further increase stability and reliability of a process of testing the semiconductor device 2000. Further, each of the probe cards 100 may be formed using conventional semiconductor process technologies, including forming all of the probe needles 130 of the probe card at the same time and by a deposition process on corresponding wiring (e.g., contact pads 128, through vias 126, redistribution lines 124 and/or vertical contacts 164) that provide corresponding electrical connections to the test main body 220.

The method of testing the semiconductor device according to the present embodiment also includes a method of testing a semiconductor device by bringing probe needles of a conventional probe card into contact with side surfaces of bumps of the semiconductor device. That is, a method of testing a semiconductor device by bringing probe needles having long and/or more complex structures (e.g., as described herein) into contact with side surfaces of bumps of the semiconductor device is also within the scope of the embodiments and this invention.

Figure 8B:
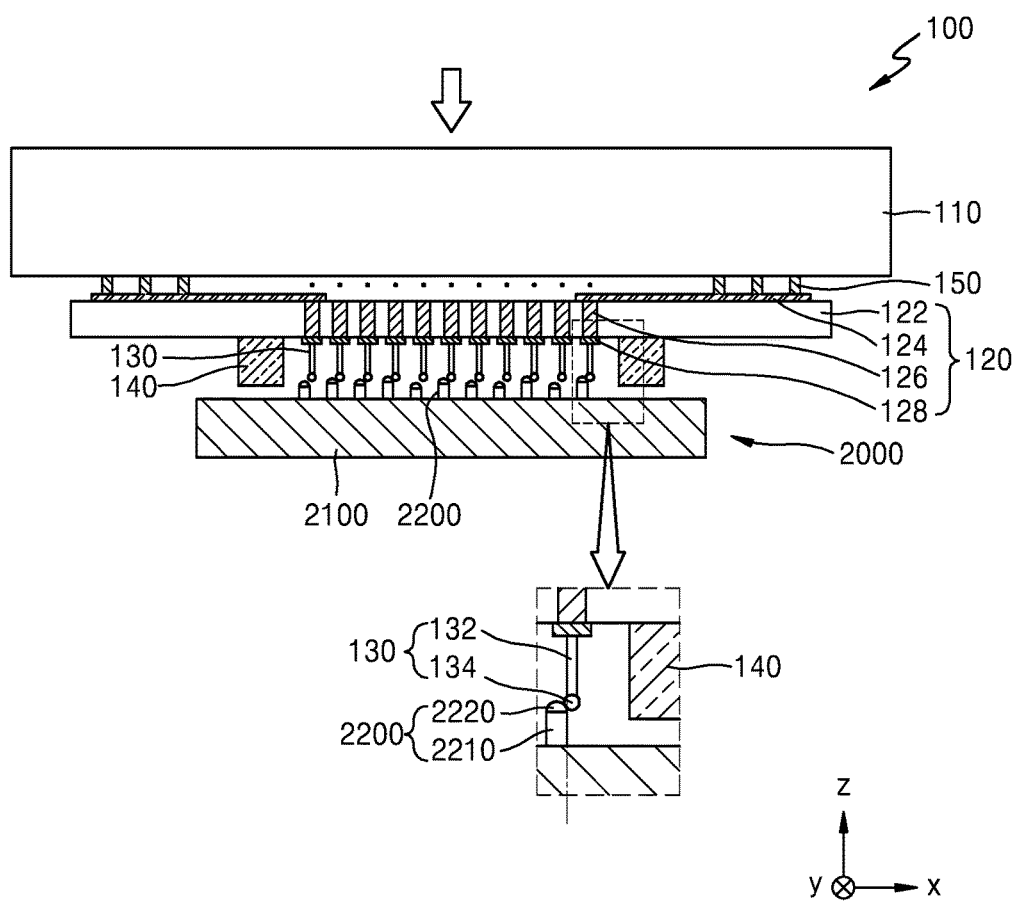
Figure 8C:
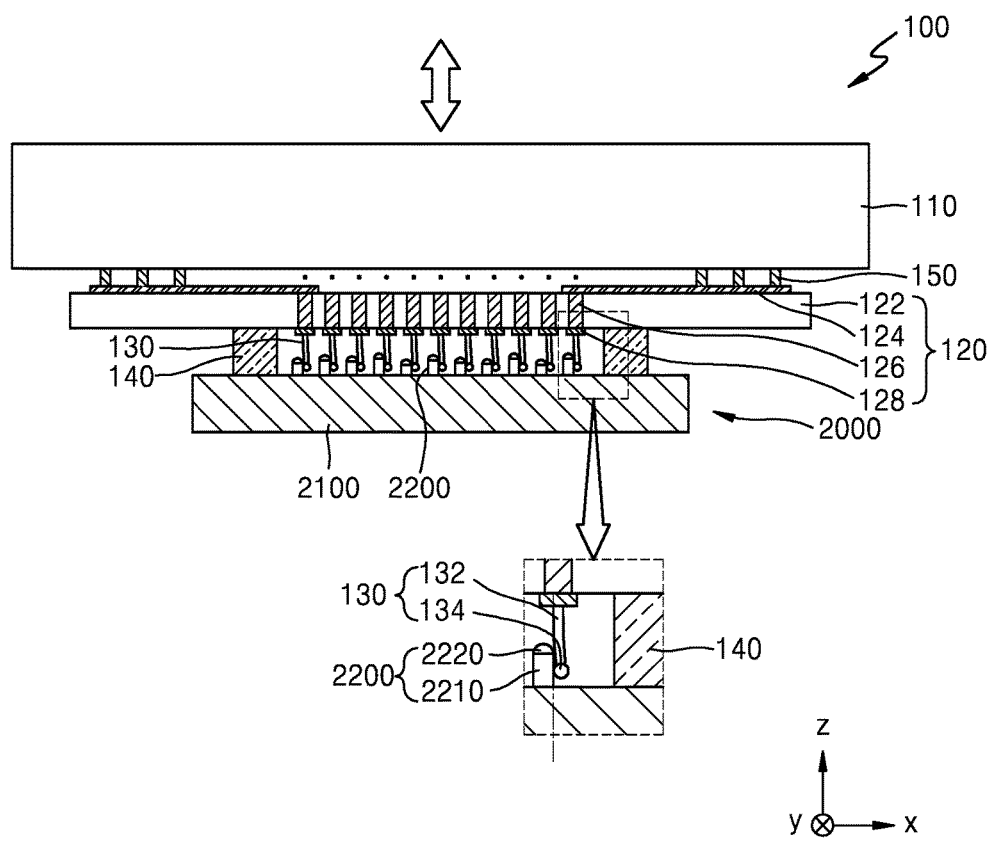

FIGS. 8A to 8C are cross-sectional views corresponding to main operations of the method of testing the semiconductor device shown in FIG. 7, according to an embodiment. FIG. 8A provides an example of the alignment operation of S120, and FIGS. 8B and 8C provide an example of the contact operation of S130.

Referring to FIG. 8A, the probe needle 130 of the probe card 100 may be horizontally aligned with the bump 2200 of the semiconductor device 2000. The alignment may occur by moving the probe card 100 in a horizontal direction as illustrated with a thick bi-directional arrow over the probe card 100. The horizontal movement of the probe card 100 may be movement of the probe card 100 on an x-y plane, which may include moving the probe card 100 in a y direction after moving the probe card 100 in an x direction or conversely. Also, in some embodiments, the horizontal movement of the probe card 100 on the x-y plane may include moving the probe card 100 in the x direction and the y direction simultaneously. Horizontal movement of the probe card 100 may comprise rotation of the probe card 100 about a vertical axis.

Such horizontal movement to align the bump 2200 of the semiconductor device 2000 may instead and/or also be performed by moving the semiconductor device 2000 instead of the probe card 100 in the horizontal direction by using the stage (refer to 300 in FIG. 1). Alternatively, both the probe card 100 and the semiconductor device 2000 may move in the horizontal direction.

In the method of testing the semiconductor device according to the present embodiment, the probe needle 130 may be aligned with the bump 2200 so that a side surface of a beam 132 of the probe needle 130 is positioned directly under the probe needle 130. For example, the side surface of the metal pillar 2210 of the bump 2200 may be positioned directly under the probe needle 130 as illustrated with an alternating long-short dashed line. In this example, only a part of the tip 134 of the probe needle 130 overlaps the corresponding bump 2200. In some embodiments, the probe needle 130 may be aligned with the bump 2200 so that the side surface of the beam 132 of the probe needle 130 is directly over the bump 2200 (e.g., horizontally positioned between the opposite side surfaces of the metal pillar 2210 of the bump 2200. Thus, an overlap area between the tip 134 of the probe needle 130 and the bump 2200 in the vertical direction may further increase. In some embodiments, the probe needle 130 may be aligned with the bump 2200 so that the horizontally outermost edge of the tip 134 of the probe needle 130 (e.g., the leftmost or rightmost position of the tip 134) may be located directly above the side surface of the metal pillar 2210 of the bump 2200. In this case, an overlap area between the tip 134 of the probe needle 130 and the bump 2200 in the vertical direction may be almost 0.

Referring to FIG. 8B, the probe card 100 may be moved downward so that the tip 134 of the probe needle 130 is brought into contact with an upper portion of the bump 2200. Here, the upper portion of the bump 2200 may be a solder 2220 or an upper side surface of the metal pillar 2210. After such contact, the tips 134 of some of the probe needles 130 initially may not be in contact with the corresponding bump 2200 located directly below these probe needles 130.

As in the alignment operation, the semiconductor device 2000 may be moved upward by using the stage 300 without moving the probe card 100 downward, or both the probe card 100 and the semiconductor device 2000 may be moved vertically, so that the tip 134 of the probe needle 130 may be brought into contact with the upper portion of the bump 2200. In the following descriptions, the horizontal movement or descent of the probe card 100 may be replaced by the horizontal movement or ascent of the semiconductor device 2000 using the stage 300 or the simultaneous movement of the probe card 100 and the semiconductor device 2000.

Referring to FIG. 8C, the probe card 100 may be moved further downward so that the tip 134 of the probe needle 130 is brought into contact with a side surface of the bump 2200, such as the side surface of the metal pillar 2210. When the tip 134 of the probe needle 130 is in contact with the side surface of the metal pillar 2210, the probe needle 130 may be bent or curved, and deviate its alignment with respect to a normal line to a bottom surface of a substrate 122 as shown in an enlarged view of the FIG. 8C. Elasticity of the probe needle 130 may resist this bending to provide a force against the side surface of the bump 2200. For example, the probe needle 130 may form a leaf spring that deviates from its resting shape due to the force applied to the probe needle 130 from the bump 2200 upon moving the probe needle 130 into contact with the bump 2200.

The lateral contact process may further include moving the probe card 100 in a horizontal direction to ensure a lateral contact of all the probe needles 130 with all the bumps 2200, which may also reduce contact resistances therebetween. For example, during the alignment process, when the side surface of the tip 134 of the probe needle 130 is aligned with the side surface of the metal pillar 2210 of the bump 2200, the lateral contact may be weakly or poorly performed only by moving the probe card 100 downward. To address this possibility, the probe card 100 also may be horizontally moved in a direction toward the side of the bump 2200 opposite the side contacting the probe needle 130, further bending the probe needle is bent and increasing the contacting force between the probe needle 130 and the bump 2200, so that the lateral contact therebetween may be tightly performed and contact resistance may be reduced. However, the horizontal movement of the probe card 100 should be performed within an elastic region of the probe needle 130 that does not exceed the yield strength of the probe needle 130.

The lateral contact process may include using the stopper 140 to control the spacing between support 120 and the body 2100 of the semiconductor device 2000 and thus control the vertical positions of the tips 134 of probe needles 130, such as the vertical positions of the tips 134 where testing is performed (indicated by the thick bi-directional arrow over the probe card 100). In some embodiments, the vertical positioning may be performed using an optical distance measuring apparatus instead of the stopper 140. Thus, the tips 134 of the probe needles 130 may be located at the sides of the bumps 2200 when contacting the same. For example, a tip 134 of a probe needle 130 may contact a side of a corresponding bump 2200 at a position that is below 20% of the vertical protrusion of the corresponding bump 2200 from the top of the corresponding bump 2200. For example, even when the semiconductor device 2000 is warped as described herein, contact of each of the probe needles 130 with a corresponding bump may be controlled to be at a position that is within a range of 20% to 80% of the vertical protrusion of the corresponding bump from the top of the corresponding bump 2200. Thus, contact between each probe needle 130 and the side of a corresponding bump 2200 may be assured without unintended contact with other structure of the semiconductor device 2000 (such as the upper surface of the body 2100 of the semiconductor device 2000).

Figure 9A:
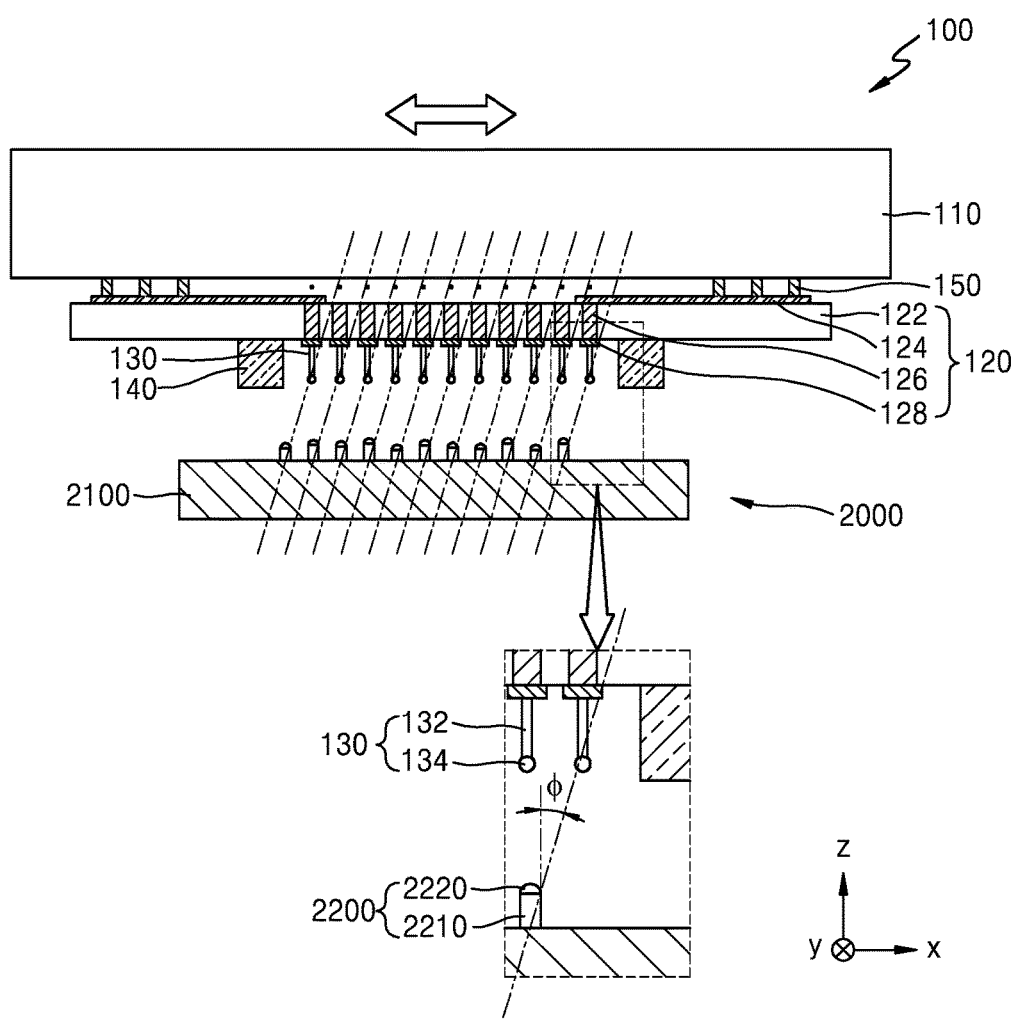
FIGS. 9A to 9C are cross-sectional views corresponding to main operations of the method of testing the semiconductor device shown in FIG. 7, according to an embodiment.
Figure 9B:
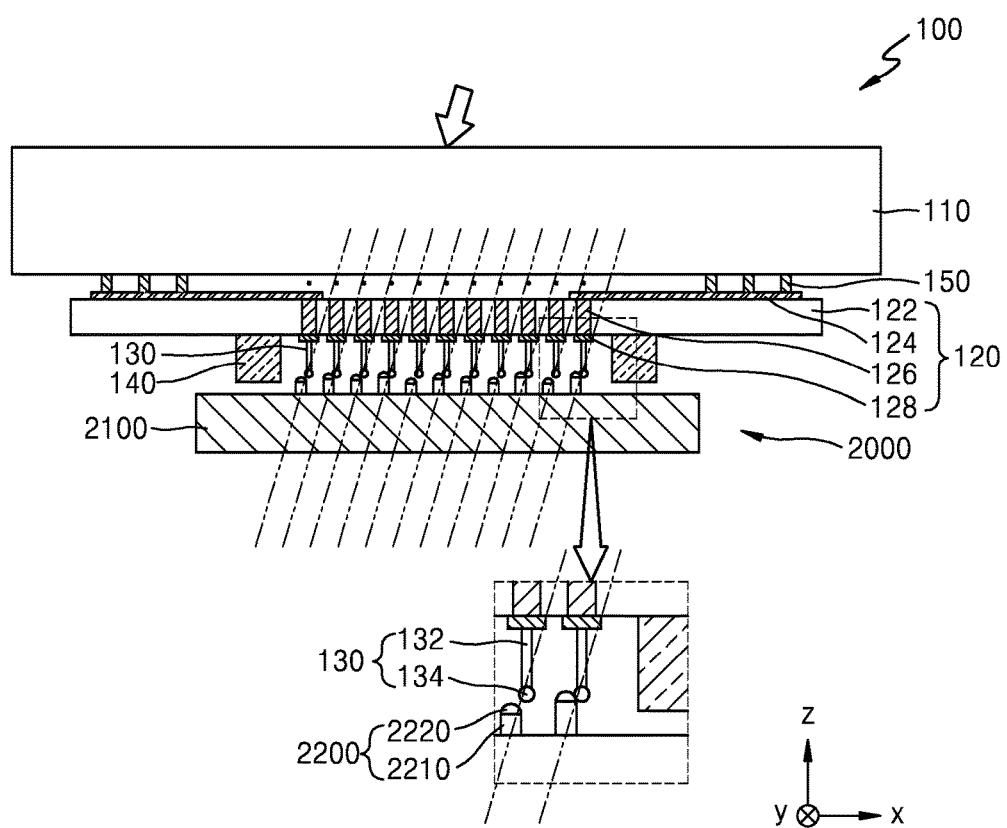
Figure 9C:
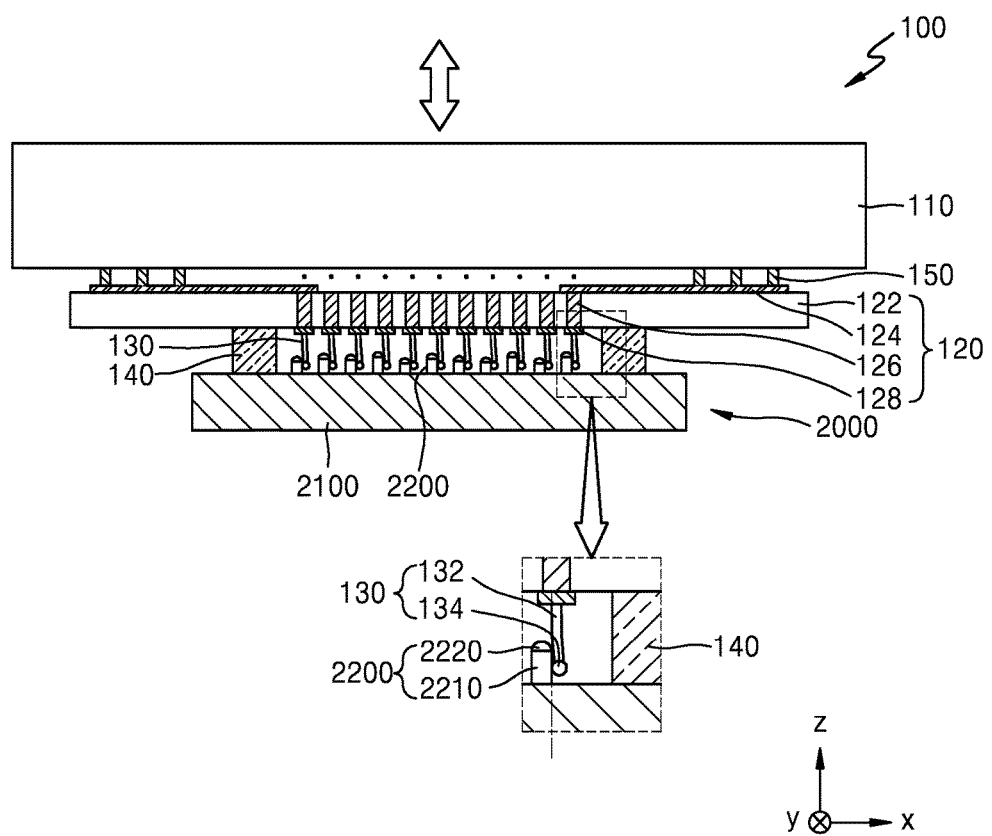

FIGS. 9A to 9C are cross-sectional views corresponding to main operations of the method of testing the semiconductor device of FIG. 7, according to an embodiment. FIG. 9A corresponds to the alignment operation S120, and FIGS. 9B and 9C may correspond to the contact operation S130.

Referring to FIG. 9A, a probe needle 130 of a probe card 100 may be positioned with respect to a bump 2200 of the semiconductor device 2000. The positioning may be performed as described with respect to step S120 of FIG. 7 and with respect to FIG. 8A and achieved by moving the probe card 100 and/or stage 300 in a horizontal direction. However, in the method of testing the semiconductor device according to the present embodiment, the initial alignment of step S120 may result in the probe needle 130 positioned to not overlap the bump 2200 that it will eventually contact.

Thus, as shown in an enlarged view of FIG. 9A, the probe needle 130 may be initially positioned so that a tip 134 of the probe needle 130 does not overlap any portion of the corresponding bump 2200 (that it will eventually contact). Also, the tip 134 of the probe needle 130 may be located along a line extending between the tip 134 and the side surface of the corresponding bump 2200 (illustrated as a two-point chain line) forms a first inclination angle ϕ with respect to the vertical direction. The two-point chain line defining the first inclination angle ϕ may correspond to a line along which the probe card 100 will move subsequently.

Referring to FIG. 9B, the probe card 100 may be moved sideways downward along the two-point chain line so that the tip 134 of the probe needle 130 is brought into contact with the upper portion of the bump 2200. Here, the upper portion of the bump 2200 may be a solder 2220 or an upper side surface of a metal pillar 2210. Also, in some embodiments, the tips 134 of some of the probe needles 130 initially may not be in contact with a corresponding one of the bumps 2200 immediately after this contact.

In another case, the probe card 100 may not move consistently in the same linear direction but may instead first move straight downward (e.g., only the vertical direction), and then move horizontally so that the tip 134 of the probe needle 130 is brought into contact with the upper portion of the bump 2200.

Referring to FIG. 9C, the probe card 100 may be moved further downward so that the tip 134 of the probe needle 130 may be brought into contact with the side surface of the bump 2200, such as the side surface of the metal pillar 2210. When the tip 134 of the probe needle 130 is in contact with the side surface of the metal pillar 2210, the probe needle 130 may be bent to deviate from a normal line perpendicular to a bottom surface of the substrate 122 as shown in an enlarged view of FIG. 9C. The relative motion (e.g., between the bump 2200 and the probe needle 130) described herein may be achieved by moving the semiconductor device 2000 using the stage 300 instead of (or in addition to) the probe card 100 so that the tip 134 of the probe needle 130 may be brought into contact with the bump 2200 in the manner described.

As in FIG. 8C, the lateral contact process may further include moving the probe card 100 in the horizontal direction to ensure a lateral contact of all the probe needles 130 with all the bumps 2200 and reduce contact resistances. For example, when the lateral contact is weakly or poorly performed only by the downward movement of the probe card 100, the probe card 100 may be horizontally moved in a direction in which the probe needle 130 is bent. The resulting configuration of the probe card 100, probe needles 130 and contact results may thus be the same as described with respect to FIG. 8C (repetitive description being avoided for purposes of brevity). As a result, the contact may be tightly performed, and contact resistance may be reduced. Furthermore, the lateral contact process may include obtaining the spacing between the probe card 100 and the semiconductor device 2000 (and thus the vertical positions of the tips 134 along the sides of the bumps 2200) using stopper(s) 140 or an optical distance measuring apparatus.

Figure 10:
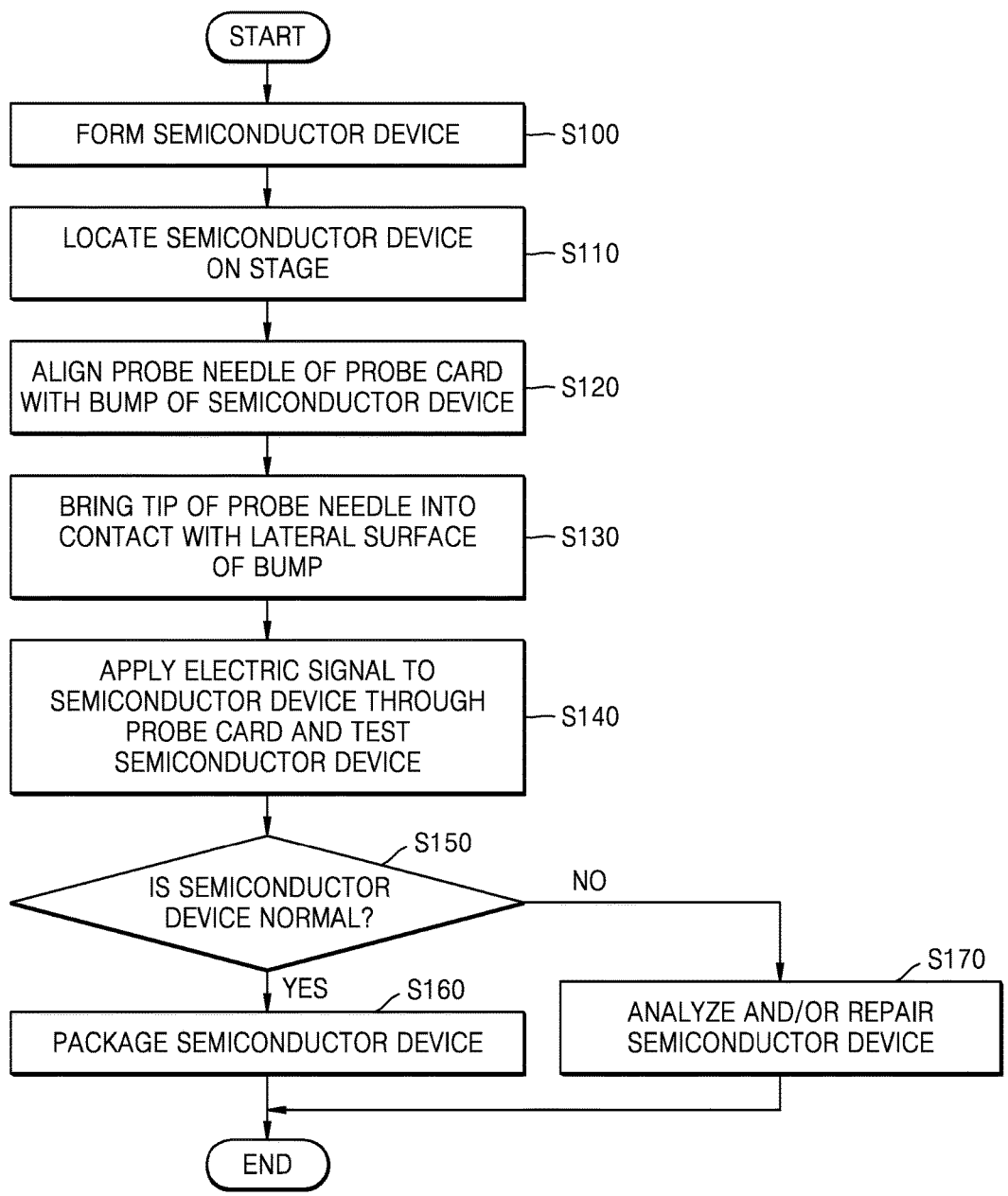
FIG. 10 is a schematic flowchart of a method of manufacturing a semiconductor device by using a testing method according to an embodiment.

FIG. 10 is a schematic flowchart of a method of manufacturing a semiconductor device according to an embodiment. The flowchart of FIG. 10 will be described with reference to FIGS. 1 and 2. Features described elsewhere herein, such as with respect to FIG. 7, may be simplified or omitted here.

Referring to FIG. 10, a forming operation S100, a location operation S110, an alignment operation S120, a contact operation S130, and a test operation S140 may be sequentially performed.

The forming operation S100 may comprise forming one or more semiconductor devices, such as semiconductor device 2000 of FIG. 1 with semiconductor processing, such as depositing and patterning insulating and conductive layers on a semiconductor substrate (e.g., on a silicon wafer). For example, a gate oxide layer and gate electrode layer may be deposited on a semiconductor substrate and patterned via photolithography to form gate electrodes of transistors (in some examples, the gate electrodes may be dummy gate electrodes which are later removed and replaced with the final gate electrode material). Source/drain regions of the transistors may be formed in an active region of the semiconductor substrate (which may be a fin-shaped active region) by doping the active region using the gate electrode as a mask. An insulating layer may be deposited and planarized and patterned. A conductive layer (e.g., metal, such as tungsten, aluminium, gold, etc.) may be formed thereon filling openings in the patterned insulating layer. The deposited conductive layer may be formed as a pattern of discrete conductive lines and/or conductive vias by planarizing the deposited conductive layer (e.g., by CMP). Several patterned conductive layers may be formed, each neighboring conductive layer being separated by a corresponding insulating layer (e.g., interlayer dielectric). An upper conductive layer (which may be the topmost conductive layer patterned by photolithography) may comprise a plurality of chip pads 2110. Transistors may thus be formed, such as MOS transistors each having two S/D regions and a channel region interposed therebetween and under a corresponding gate electrode. These transistors may be interconnected by the conductive lines and vias to form logic elements (e.g., NAND gates, NOR gates, inverters, etc.) which may be interconnected to form an integrated circuit of the semiconductor device. The chip pads 2110 of the semiconductor device 2000 may form signal and power terminals of the semiconductor device 2000 (which may be or correspond to a semiconductor chip when singulated from the semiconductor wafer) which may provide signal and power communication to the internal circuits (e.g., the integrated circuit) of the semiconductor device 2000. A passivation layer (e.g., an insulating protective layer, such as an oxide film) may be deposited over the chip pads 2110 in some examples. Patterning described herein may comprise depositing a photoresist layer on the insulating layer to be patterned, patterning and developing the photoresist layer using photolithography (e.g., selectively exposing the photoresist to light using a photolithographic mask having a pattern corresponding to the pattern to be formed in the photoresist), developing the photoresist to selectively remove portions of the photoresist to pattern the photoresist, and using the subsequently formed photoresist pattern as a mask to etch and pattern the underlying insulating layer.

Step S100 may comprise forming bumps 2200 on chip pads 2110. For example, with reference also to FIGS. 12A-12C, when a passivation layer 2120 is deposited over the chip pads 2110, the passivation layer 2120 may be patterned to expose the chip pads 2110 through corresponding holes in the passivation layer 2120. A conductive seed layer 2230 (e.g., a copper layer) may be deposited on the surface of the body 2100 of the semiconductor device 2000 in electrical contact with the chip pads 2110. Prior to forming the conductive seed layer 2230, one or more conductive layers may be formed between the seed layer 2230 and the chip pads 2110, such as barrier layer 2240. Further, one or more other insulative layers may be formed between the passivation layer 2120 and the seed layer 2230, such as resin layer 2400. A mold layer, such as a patterned photoresist layer, may be formed thereon having openings, each positioned over corresponding chip pads 2110 and exposing the seed layer. Metal pillars 2210 may be formed within the openings of the mold layer, such as by performing a first electroplating process to selectively deposit a first metal (e.g., comprising copper, nickel) within the openings of the mold layer thereby forming metal pillars 2210. A second electroplating process may be formed to deposit a second metal (e.g., solder) within the openings of the mold layer directly on the first metal to thereby form the tips of the bumps 2200, such as solder 2220. The second metal may be relatively soft as compared to the first metal, as describe herein. Further exemplary details of a method which may be used to form bumps 2200, bump structure and related interconnections may be found in U.S. Patent Publication No. 2012/0295434, the contents of which is hereby incorporated by reference in its entirety.

The location operation S110 to the test operation S140 may be the same as described with reference to FIG. 7. Here, a semiconductor device 2000, which is a test target, may be a wafer-level semiconductor device (e.g., integrally formed with other semiconductor devices as part of a wafer), a semiconductor chip (e.g., singulated or cut from a wafer) or a semiconductor package. The wafer-level semiconductor device may include a plurality of semiconductor devices formed as part of a wafer (each corresponding to a semiconductor chip later cut from the wafer) or a plurality of semiconductor packages integrally formed with such semiconductor devices formed as part of a wafer. Packaging of wafer-level semiconductor devices as described herein may comprise stacking and/or electrically interconnecting other semiconductor devices (e.g., semiconductor chips) on the semiconductor devices integrally formed as part of the wafer, physically and electrically connecting the semiconductor devices integrally formed as part of the wafer to a package substrate and/or interposer, and/or adding an encapsulant or protective layer (e.g., a resin layer) to cover all or some of this possible additional structure connected to the semiconductor devices while the semiconductor devices are integrally formed as part of the wafer. After such wafer-level packaging, the semiconductor devices may be singulated along with such additional structure and/or the encapsulant (e.g., resin). After the test operation S140, it may be determined if the semiconductor device 2000 is normal on a predetermined basis (S150). If the semiconductor device 2000 is normal (Yes), a subsequent packaging processes may be performed on the semiconductor device 2000 (S160). For example, when the semiconductor device 2000 is a wafer-level semiconductor device integrally formed with a plurality of semiconductor devices (as part of a wafer), the subsequent processes may include sawing the wafer into individual semiconductor chips, stacking and mounting the normal semiconductor chip on a printed circuit board (PCB) (e.g., alone or with one or more other semiconductor chips), and encapsulating the mounted semiconductor chip(s) with an encapsulant. In some embodiments, after the test operation S140, a stacked-chip packaging process may be performed on the wafer without or prior to performing a sawing process. In this case, the packaging process of step S160 may include stacking another semiconductor chip on the normal semiconductor chip while part of the wafer. While the method of FIG. 10 is described with respect to a single semiconductor device, it should be appreciated that the method of FIG. 10 may be performed for a plurality of semiconductor devices (such as all the semiconductor devices formed within the same wafer, as described herein). In this instance, the packaging step S160 may include stacking other semiconductor chips only on semiconductor devices (integrally formed in the wafer) that were determined to be normal in step S150.

When the semiconductor device 2000 is a wafer-level semiconductor device including semiconductor packages, the step S160 may include sawing a wafer into individual semiconductor packages. In addition, such semiconductor packages may themselves be further packaged with other semiconductor packages (e.g., package-on-package (POP) devices) and/or mounted on a printed circuit board (PCB) and assembled to form an electronic device (e.g., to form a memory module, solid state drive, SIM card, etc.) Such semiconductor packages may be single-chip packages or multi-chip packages.

As noted herein the semiconductor device 2000 subject to steps S110 to S140 may be an individual semiconductor package. Step S160 may comprise mounting and packaging the non-defective semiconductor package on a main board or an interposer. The semiconductor package may be further packaged with one or more other semiconductor packages (e.g., package-on-package (POP) devices) and/or mounted on a printed circuit board (PCB) and assembled to form an electronic device (e.g., to form a memory module, solid state drive, SIM card, etc.) Such semiconductor packages may be single-chip packages or multi-chip packages.

If the semiconductor device 2000 is abnormal (No), that is, if the semiconductor device 2000 is a defective unit, the semiconductor device 2000 may be analysed (S170) (e.g., to determine the cause of the defect). Subsequent semiconductor devices formed in step S100 (when performing the method of FIG. 10 again) may have certain process variables adjusted (e.g., exposure time in a photolithographic patterning step, etching time, temperature, etc.) in response to determining the cause of the defect). When the semiconductor device 2000 is a wafer-level semiconductor device, after a sawing process is performed on the wafer to singulate the semiconductor devices therein, defective semiconductor devices may be separated from the non-defective semiconductor devices subject to packaging step S160. Additionally, a repair process may be performed on the semiconductor device 2000 as part of step S170. For example, when the semiconductor device 2000 is found not to be normal in step S150, redundant circuitry within the semiconductor device 2000 may be selected to replace identified defective circuitry. For example, when the semiconductor device 2000 is a memory device (e.g., DRAM or NAND flash memory), portion(s) of the memory determined to be defective may be identified by their memory address(es), and the memory device may be programmed with the memory address(es) (such as by programming a fuse bank or other one-time-programmable non-volatile register(s) within the memory device) so that the memory device will be configured to access a redundant memory rather than the defective memory portion when an external device desires access to a memory identified by such memory address(es). In addition, steps S110 to S140 may be used to determine that the semiconductor device 2000 may normally operate at relatively lower internal clock speeds (e.g., 1600 MHz) but not operate normally at relatively higher clock speeds (e.g., 2400 MHz). Such clock speed determination may be programmed into the semiconductor device 2000 to control operation of the semiconductor device 2000, such as internally configuring an internal clock of the semiconductor device 2000 and/or allowing an external device to read such clock speed information (when integrated and in communication as part of a system) to configure the external device to appropriately control the semiconductor device 2000 (e.g., by providing an external clock to the semiconductor device 2000 corresponding to the appropriate clock speed determined in steps S110 to S140). Further, when the semiconductor device is a volatile memory device, steps S110 to S140 may be used to determine appropriate refresh rates of the volatile memory and/or determine weak cell rows of the memory that may should be refreshed at a higher refresh rate than other normal cell rows of the memory. Such refresh rate information may be programmed into the memory device to configure the memory device to control refresh operations in accordance with the programmed refresh rates.

FIGS. 11A to 11F are schematic cross-sectional views illustrating a method of manufacturing a probe card according to an embodiment. Repetitive descriptions, such as with respect to FIGS. 1 and 2, will be simplified or omitted for brevity.

Figure 11A:
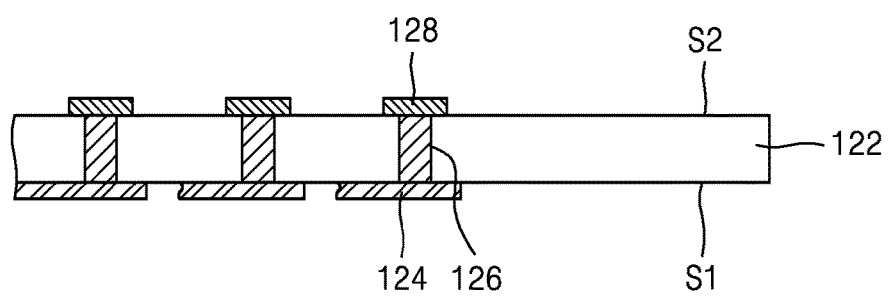
FIGS. 11A to 11F are schematic cross-sectional views of a method of manufacturing a probe card according to an embodiment.

Referring to FIG. 11A, redistribution lines 124, through vias 126, and contact pads 128 may be formed in a substrate 122. As noted herein, the contact pads 128 may be omitted. The substrate 122 may be a conventional copper clad laminate (CCL) used for a printed circuit board (PCB), prepreg, polyimide, ceramic, or silicon. The substrate may include a single layer or a multi-layered structure. The redistribution lines 124, the through vias 126, and the contact pads 128 may be formed by using a typical process of forming PCBs. In some embodiments, the redistribution lines 124, the through vias 126, and the contact pads 128 may be formed by a separate semiconductor process.

The substrate 122, the redistribution lines 124, the through vias 126, and the contact pads 128 may correspond to the support 120 of FIG. 2. In FIG. 11A, a top surface and a bottom surface of the substrate 122 respectively correspond to a bottom surface and a top surface of the substrate 122 of the support 120 shown in FIG. 2. For example, a first surface 51 of the substrate 122 may correspond to a top surface of the substrate 122 coupled to the circuit board 110 in FIG. 2, while a second surface S2 of the substrate 122 may correspond to a bottom surface of the substrate 122 on which probe needles 130 are located, in FIG. 2.

Figure 11B:
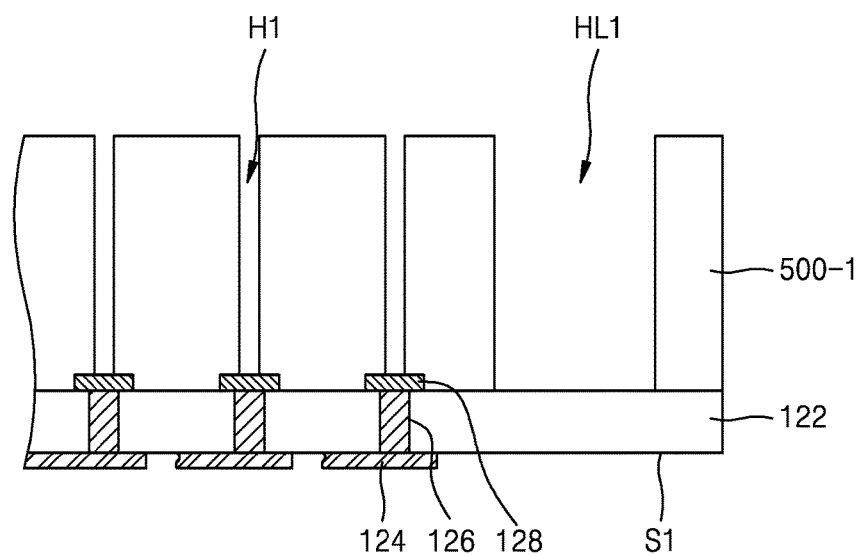

Referring to FIG. 11B, a first photoresist (PR) layer may be formed on the second surface S2 of the substrate 122 to cover the contact pads 128. A thickness of the first PR layer may correspond to the length of the probe needles to be formed. For example, the thickness of the first PR layer may be several hundred μm or less, such as less than 300 μm, or less than 200 μm. In this exemplary method of manufacturing the probe card, the thickness of the first PR layer may be in a range from about 100 μm to about 200 μm. After the first PR layer is formed, the first PR layer may be patterned by using a photolithography process to form a first PR pattern 500-1. The first PR pattern 500-1 may be used as a mold layer to form corresponding patterns in the openings of the first PR pattern 500-1. Although the pattern 500-1 is a photoresist PR in this example, other material layers may be patterned to obtain pattern 500-1 (and as a mold for forming the probe needles), such as silicon oxide. For example, an insulating layer (e.g., $SiO_2$) may be formed on the structure shown in FIG. 11A and patterned to achieve the pattern 500-1 illustrated in FIG. 11-B. Such patterning may be achieved by forming a photoresist on the insulating layer, patterning the photoresist layer and etching the insulating layer using the patterned photoresist layer as a mask and removing the patterned photoresist layer.

The first PR pattern 500-1 may include a plurality of holes H exposing top surfaces of the contact pads 128. Also, the first PR pattern 500-1 may include a first hole-line HL1 for the stopper (refer to 140 in FIG. 2). The first hole-line HL1 may be configured to surround a region in which the holes H are formed. The first hole-line HL1 may have a ring shape in which the entire first hole-line HL1 is united into one (continuous and unbroken) or be formed as a group of discrete holes formed at the periphery of the substrate 122 to surround the region in which the holes H are formed (e.g., along a ring-shaped pattern). The phrase "hole-line" as used herein refers to a series of holes (only one of which being shown in the cross sectional illustration of FIG. 11A) or a hole formed as a trench (e.g., continuously formed in the horizontal direction). As shown in FIG. 11B, a width of the first hole-line HL1 may be much greater than a width of the holes H. For example, the width of the first hole-line HL1 may be several to several tens of times greater than the width of the holes H. Naturally, the width of the first hole-line HL1 is not limited thereto.

As described above, the stopper 140 may be omitted from the probe card 100. In this case, the first hole-line HL1 may not be formed.

When a probe card includes a stress absorption layer as in the embodiment shown in FIG. 5A, before the first PR layer is formed, the stress absorption layer may be formed on the second surface S2 of the substrate 122, and the first PR layer may be then formed on the stress absorption layer.

Figure 11C:
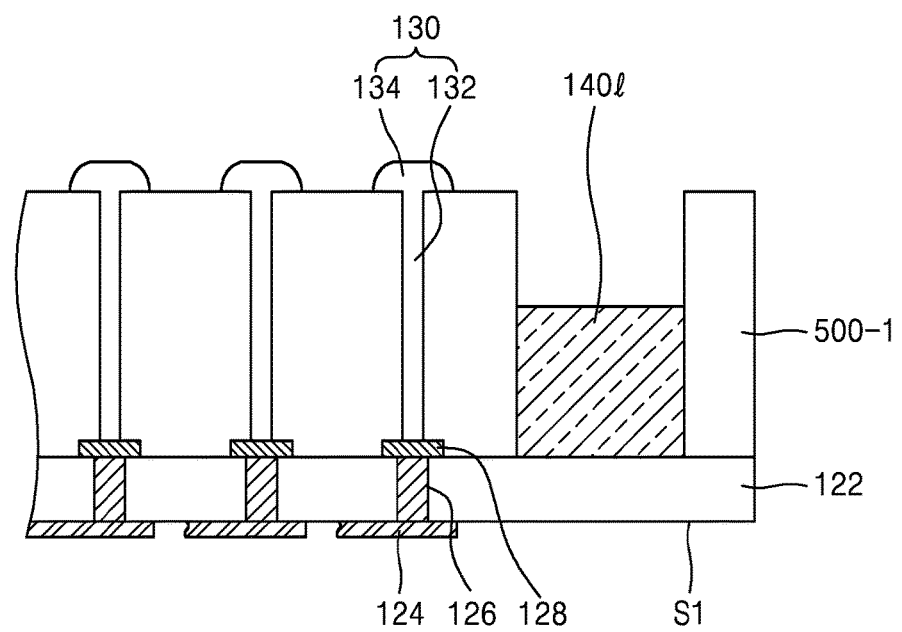

Referring to FIG. 11C, probe needles 130 may be formed by filling the holes H with a metal, and a lower stopper portion 1401 may be formed by filling a lower portion of the first hole-line HL1 with a metal. The metal may be, for example, nickel, a nickel alloy, such as nickel-cobalt or nickel-manganese, tungsten, palladium, copper, silver, gold, a copper alloy, or a gold alloy. For example, the holes H and the first hole-line HL1 may be filled with a metal by using an electroplating process. Although not shown, a thin seed conductive layer for the electroplating process may be previously formed on (and/or provided with) the entire second surface S2 of the substrate 122. The electroplating process may comprise immersing the structure of FIG. 11B in a solution (an electrolyte bath) containing one or more metal ions that are plated onto exposed (and charged) conductors (e.g., the seed conductive layer exposed by holes H1 and HL1 and the electroplated metal subsequently deposited thereon).

Since the first hole-line HL1 has a greater width than each of the holes H, when the holes H and the first hole-line HL1 may be completely filled with a metal by using an electroplating process, the first hole-line HL1 may not be completely filled with the metal when the holes H have been completely filled with the metal. Thus, only the lower portion of the first hole-line HL1 may be filled with the metal as shown in FIG. 11C, thereby forming the lower stopper portion 1401.

Each of the probe needles 130 may include a beam 132 and a tip 134. The tip 134 may have, for example a hemispherical shape. The tip 134 may be hemispherically shaped by covering portions of a top surface of the first PR pattern 500-1 around the holes H with a metal by continuing the electroplating process after holes H have been completely filled with metal during the initial electroplating process. In some embodiments, after all or part of the holes H are filled with a metal by using an electroplating process, the electroplating process may be completed, thereby obtaining the shape of the probe needle 130b shown in FIG. 6A.

In some embodiments, a material film for forming the tip 134 may be further formed on the top surface of the first PR pattern 500-1 and patterned to form a spherical or polyhedral space in a position corresponding to the hole H. Thereafter, the spherical or polyhedral space may be filled with a metal by using an electroplating process. Thus, the probe needles 130c to 130e including the tips 134c to 134e having the shapes described herein, such as those shown in FIGS. 6B to 6D, may be obtained.

Figure 11D:
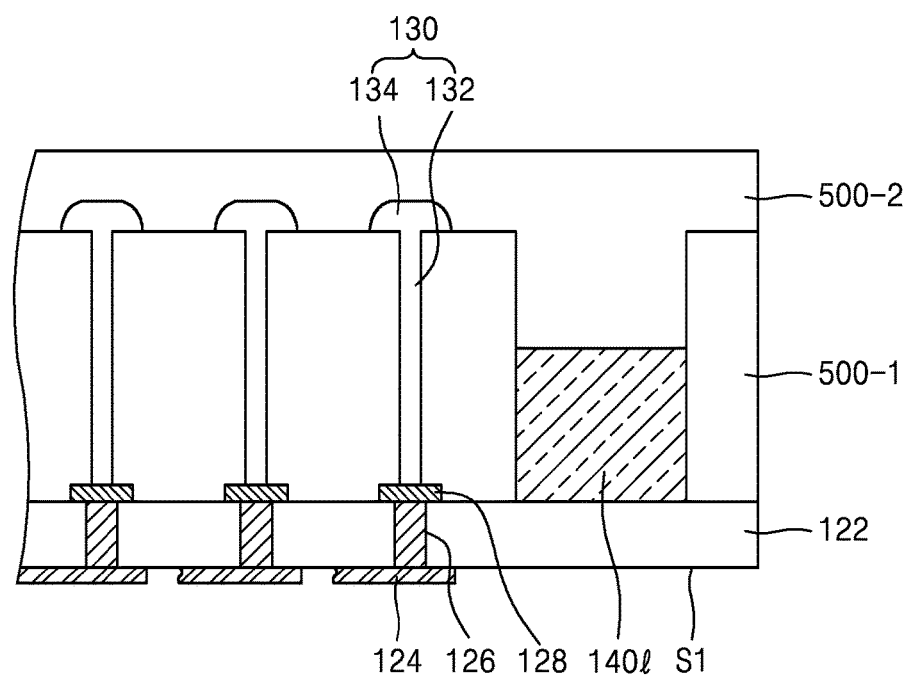

Referring to FIG. 11D, a second PR layer 500-2 may be formed on the first PR pattern 500-1 to cover the probe needle 130 and the lower stopper portion 1401. A thickness of the second PR layer 500-2 from the top surface of the first PR pattern 500-1 may depend on a thickness of the stopper (refer to 140 in FIG. 2). For example, the second PR layer 500-2 may be formed to such a thickness as to completely cover the tip 134 of the probe needle 130. As described above, during a test, the stopper 140 may serve to protect the probe needle 130 and also, flatten the body 2100 of the semiconductor device 2000.

Figure 11E:
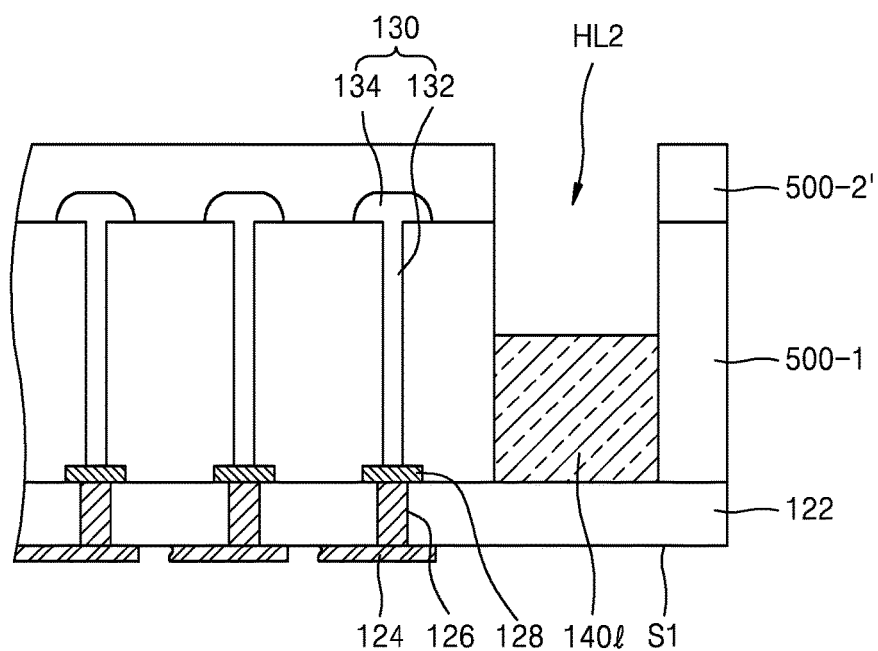

Referring to FIG. 11E, after the second PR layer 500-2 is formed, the second PR layer 500-2 may be patterned by using a photolithography process to form a second PR pattern 500-2'. The second PR pattern 500-2' may include a second hole-line HL2 exposing the top surface of the lower stopper portion 1401. The second hole-line HL2 may have, for example, substantially the same shape as the first hole-line HL1. Thus, the second hole-line HL2 may have substantially the same width as the first hole-line HL1. However, it should be appreciated that the second hole-line HL2 need not have the same width as the first hole-line HL1 (e.g., it may be wider or smaller) and/or may not align with the first hole-line HL1 as shown in FIG. 11E.

Figure 11F:
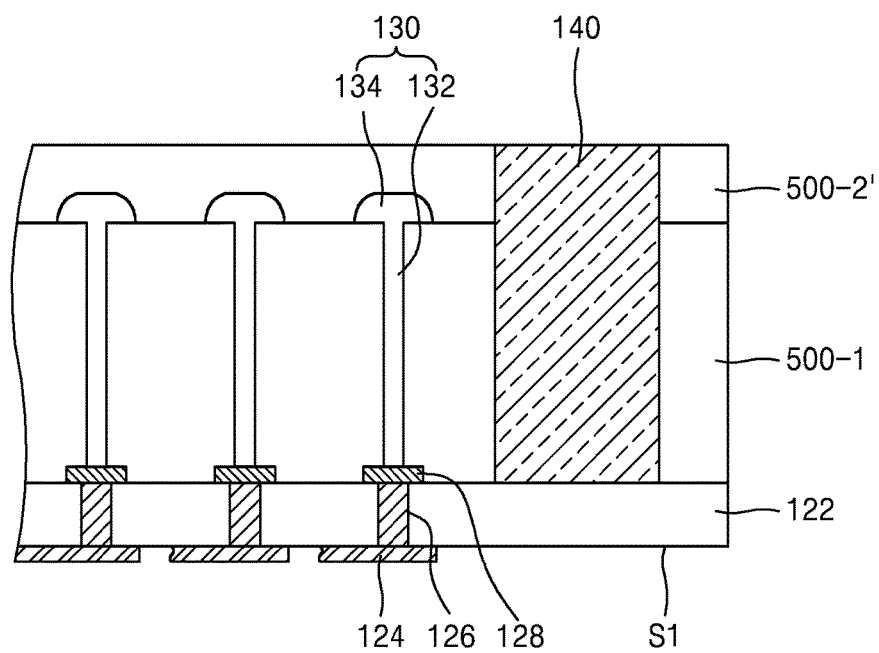

Referring to FIG. 11F, a stopper 140 may be formed by filling the second hole-line HL2 with a metal. The metal may be substantially the same as the metal that is previously used to form the probe needle 130 and the lower stopper portion 1401. Also, the second hole-line HL2 may be filled with a metal by using an electroplating process.

After the stopper 140 is formed, the first PR pattern 500-1 and the second PR pattern 500-2' may be removed to form the probe needle 130 and the support 120 shown in FIG. 2. Subsequently, the substrate 122 may be coupled to the circuit board 110 so that the redistribution line 124 located on the first surface 51 of the substrate 122 may be electrically connected to the circuit board 110 through the connection member (refer to 150 in FIG. 2) to obtain the probe card 100.

While the inventive concept has been particularly shown and described with reference to embodiments thereof, it will be understood that various changes in form and details may be made therein without departing from the spirit and scope of the following claims.

What is claimed is:

1. A probe card for testing a semiconductor device, the probe card comprising:
   a support comprising a substrate, a plurality of contact pads on a first surface of the support, and wiring formed of a plurality of horizontally extending redistribution lines and vertically extending vias to provide electrical connections between each contact pad and a corresponding contact point on a second surface of the support opposite to the first surface; and
   a plurality of probe needles, each probe needle connected to the support at a proximal end of the probe needle, each probe needle having an elongated beam extending away from the support and a tip at a proximal end of the probe needle,
   wherein the length of each of probe needle from its proximal end to its distal end is 300 micrometers (μm) or less, and
   wherein each probe needle forms a leaf spring and is formed of a material such that that the material allows for an angular deviation of the tip of the probe needle by at least 3° from a resting position of the probe needle upon the tip of the probe needle receiving a force in a direction perpendicular to its length that does not exceed the elastic yield strength of the corresponding beam of the probe needle.

2. The probe card of claim 1, wherein the maximum width of each tip of the probe needle is greater than the maximum width of the corresponding beam to which the tip is connected.

3. The probe card of claim 1, wherein the support further comprises a layer of an elastic organic material interposed between the substrate and the plurality of probe needles.

4. The probe card of claim 3, wherein the layer of the elastic organic material is compressive.

5. The probe card of claim 4, wherein each probe needle is formed of a metal having an elastic yield strength to provide a compressive force to the elastic organic material sufficient to change the thickness of the layer of the elastic organic material at a corresponding base of the probe needle upon the tip of the probe needle receiving a force perpendicular to the length of the probe needle that does not exceed the elastic yield strength of the probe needle.

6. The probe card of claim 4,
wherein each probe needle comprises a base formed on the layer of the elastic organic material, and
wherein the elastic organic material has an elasticity sufficient to allow rotation of the base of each probe needle upon the tip of the probe needle receiving a force perpendicular to the length of the probe needle that does not exceed the elastic yield strength of the probe needle.

7. The probe card of claim 6, wherein the elastic organic material is a polymer.

8. The probe card of claim 1, wherein the probe needles are spaced at a pitch of 55 µm or less.

9. The probe card of claim 1, wherein each of the probe needles are formed by the process of depositing a first metal onto a corresponding one of the contact pads.

10. The probe card of claim 1, wherein each probe needle is metallically bonded to a corresponding one of the contact pads.

11. The probe card of claim 1, wherein each probe needle is integrally formed of the same metal throughout.

12. The probe card of claim 1, wherein each tip of a probe needle has a larger width than the beam of the probe needle to which the tip is connected.

13. The probe card of claim 12, wherein each tip of a probe needle gradually reduces its width from a point of maximum width of the tip to the distal end of the tip.

14. The probe card of claim 1, wherein each probe needle has a length from its proximal end to its distal end greater than 16 times its width.

15. The probe card of claim 14, wherein the length of each probe needle is less than 20 times its width.

16. The probe card of claim 1, further comprising one or more stoppers on the first surface of the support extending away from the support a first distance that is greater than the lengths of each probe needle extending between proximal and distal ends of the probe needles.

17. The probe card of claim 16, wherein the first distance is greater than the lengths of each probe needle by no more than 30 µm.

18. A testing apparatus for testing a semiconductor device, the testing apparatus comprising:
a test main body configured to generate a plurality of test signals;
a test head coupled to the test main body to communicate first signals between a probe card and the test main body, including transmitting the plurality of test signals to the probe card;
the probe card comprising
a circuit board,
a support coupled to the circuit board comprising a substrate, a plurality of contact pads on a first surface of the support, and wiring formed of a plurality of horizontally extending redistribution lines and vertically extending vias to provide electrical connections between each contact pad and a corresponding contact point on a second surface of the support opposite to the first surface, and
a plurality of probe needles, each probe needle connected to the support at a proximal end of the probe needle, each probe needle having an elongated beam extending away from the support and a tip at a proximal end of the probe needle, wherein each of the contact points on the second surface of the support are in electrical communication with the test head to communicate first signals between the test head and the plurality of probe needles via the wiring,
wherein the length of each of probe needle from its proximal end to its distal end is 300 micrometers (µm) or less, and
wherein each probe needle forms a leaf spring and is formed of a material such that the material allows for an angular deviation of the tip of the probe needle by at least 3° from a resting position of the probe needle upon the tip of the probe needle receiving a force in a direction perpendicular to its length that does not exceed the elastic yield strength of the corresponding beam of the probe needle.

* * * * *